(12) United States Patent
Moriyama

(10) Patent No.: US 11,057,580 B2
(45) Date of Patent: Jul. 6, 2021

(54) LIGHT RECEIVING DEVICE AND METHOD FOR CONTROLLING SAME, AND ELECTRONIC APPARATUS COMPRISING DUAL COMPARISON CIRCUITS WITH SUPPLIED ZERO RESET SIGNALS

(71) Applicant: Sony Semiconductor Solutions Corporation, Kanagawa (JP)

(72) Inventor: Yusuke Moriyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 219 days.

(21) Appl. No.: 16/422,011

(22) Filed: May 24, 2019

(65) Prior Publication Data

US 2020/0003874 A1 Jan. 2, 2020

(51) Int. Cl.
*G01S 7/486* (2020.01)
*H04N 5/369* (2011.01)
*G01S 7/4861* (2020.01)
*G01S 17/10* (2020.01)
*G01S 17/894* (2020.01)

(52) U.S. Cl.
CPC ....... *H04N 5/36965* (2018.08); *G01S 7/4861* (2013.01); *G01S 17/10* (2013.01); *G01S 17/894* (2020.01)

(58) Field of Classification Search
CPC ........ G01S 17/10; G01S 7/4861; G01S 7/894; G01S 7/4863; G01S 7/4865; H04N 5/375; H04N 5/378; H04N 5/3741
USPC .......................................... 250/214 R, 208.1
See application file for complete search history.

(56) References Cited

U.S. PATENT DOCUMENTS

| | | | |
|---|---|---|---|
| 10,567,691 B2* | 2/2020 | Otaka | H04N 3/1562 |
| 2009/0021625 A1 | 1/2009 | Sowa et al. | |
| 2018/0108658 A1 | 4/2018 | Hanzawa et al. | |

FOREIGN PATENT DOCUMENTS

WO    WO 2007/026777 A1    8/2007

OTHER PUBLICATIONS

Extended European Search Report dated Sep. 27, 2019 in connection with European Application No. 19179123.5.

(Continued)

*Primary Examiner* — Que Tan Le
(74) *Attorney, Agent, or Firm* — Wolf, Greenfield & Sacks, P.C.

(57) ABSTRACT

There is provided a light receiving device including: a pixel including a first tap configured to detect a charge photoelectrically converted by a photoelectric conversion unit, and a second tap configured to detect a charge photoelectrically converted by the photoelectric conversion unit; a first comparison circuit configured to compare a first detection signal detected by the first tap and a reference signal; a second comparison circuit configured to compare a second detection signal detected by the second tap and the reference signal; a first zero reset signal generation circuit configured to generate a first zero reset signal that is supplied to the first comparison circuit when the first comparison circuit performs an auto zero operation; and a second zero reset signal generation circuit configured to generate a second zero reset signal that is supplied to the second comparison circuit when the second comparison circuit performs an auto zero operation.

9 Claims, 16 Drawing Sheets

(56) References Cited

OTHER PUBLICATIONS

Kato et al., 320 x 240 Back Illuminated 10-μm CAPD Pixels for High-Speed Modulation Time-of-Flight CMOS Image Sensor, IEEE Journal of Solid-State Circuits, vol. 53, No. 4, Apr. 2018, pp. 1071-1078.

* cited by examiner

LIGHT RECEIVING DEVICE AND METHOD FOR CONTROLLING SAME, AND ELECTRONIC APPARATUS COMPRISING DUAL COMPARISON CIRCUITS WITH SUPPLIED ZERO RESET SIGNALS

CROSS REFERENCE TO RELATED APPLICATIONS

This application claims the benefit of Japanese Priority Patent Application JP 2018-122186 filed Jun. 27, 2018, the entire contents of which are incorporated herein by reference.

BACKGROUND

The present technology relates to a light receiving device and a method for controlling the same, and an electronic apparatus, and relates particularly to a light receiving device in which distance information with suppressed element variation can be generated and a method for driving the same, and an electronic apparatus.

There is known a ranging element using an indirect time-of-flight (ToF) method. In the ranging element of the indirect ToF method, signal charges generated by photoelectrically converting reflected light are distributed to two charge accumulation regions by means of two gate electrodes driven at high speed, for example, and the distance is calculated from the allocation ratio between the signal charges (for example, see WO 2007/026777).

SUMMARY

In a ranging element, when signal charges distributed in charge accumulation regions are detected as signals, it is necessary to pay attention so that element variation is not included.

The present technology has been made in view of such circumstances, and is a technology that can generate distance information with suppressed element variation.

According to a first aspect of the present disclosure, there is provided a light receiving device including: a pixel including a first tap configured to detect a charge photoelectrically converted by a photoelectric conversion unit, and a second tap configured to detect a charge photoelectrically converted by the photoelectric conversion unit; a first comparison circuit configured to compare a first detection signal detected by the first tap and a reference signal; a second comparison circuit configured to compare a second detection signal detected by the second tap and the reference signal; a first zero reset signal generation circuit configured to generate a first zero reset signal that is supplied to the first comparison circuit when the first comparison circuit performs an auto zero operation; and a second zero reset signal generation circuit configured to generate a second zero reset signal that is supplied to the second comparison circuit when the second comparison circuit performs an auto zero operation.

According to a second aspect of the present disclosure, there is provided a method for controlling a light receiving device. A light receiving device including a pixel including a first tap configured to detect a charge photoelectrically converted by a photoelectric conversion unit, and a second tap configured to detect a charge photoelectrically converted by the photoelectric conversion unit, a first comparison circuit configured to compare a first detection signal detected by the first tap and a reference signal, and a second comparison circuit configured to compare a second detection signal detected by the second tap and the reference signal, generates a first zero reset signal and supplies the first zero reset signal to the first comparison circuit when the first comparison circuit performs an auto zero operation, and generates a second zero reset signal and supplies the second zero reset signal to the second comparison circuit when the second comparison circuit performs an auto zero operation.

According to a third aspect of the present disclosure, there is provided an electronic apparatus that includes a light receiving device including: a pixel including a first tap configured to detect a charge photoelectrically converted by a photoelectric conversion unit, and a second tap configured to detect a charge photoelectrically converted by the photoelectric conversion unit; a first comparison circuit configured to compare a first detection signal detected by the first tap and a reference signal; a second comparison circuit configured to compare a second detection signal detected by the second tap and the reference signal; a first zero reset signal generation circuit configured to generate a first zero reset signal that is supplied to the first comparison circuit when the first comparison circuit performs an auto zero operation; and a second zero reset signal generation circuit configured to generate a second zero reset signal that is supplied to the second comparison circuit when the second comparison circuit performs an auto zero operation.

According to the first to the third aspect of the present disclosure, there are provided a pixel including a first tap configured to detect a charge photoelectrically converted by a photoelectric conversion unit, and a second tap configured to detect a charge photoelectrically converted by the photoelectric conversion unit, a first comparison circuit configured to compare a first detection signal detected by the first tap and a reference signal, and a second comparison circuit configured to compare a second detection signal detected by the second tap and the reference signal, a first zero reset signal are generated and the first zero reset signal to the first comparison circuit is when the first comparison circuit performs an auto zero operation, and a second zero reset signal is generated and the second zero reset signal is supplied to the second comparison circuit when the second comparison circuit performs an auto zero operation. According to a fourth aspect of the present disclosure, there is provided a light receiving device including: a pixel including a first tap configured to detect a charge photoelectrically converted by a photoelectric conversion unit, and a second tap configured to detect a charge photoelectrically converted by the photoelectric conversion unit; a first comparison circuit configured to compare a first detection signal detected by the first tap and a reference signal; a second comparison circuit configured to compare a second detection signal detected by the second tap and the reference signal; a first vertical signal line configured to transmit the first detection signal of the pixel to the first comparison circuit; a second vertical signal line configured to transmit the second detection signal of the pixel to the second comparison circuit; a first zero reset signal generation circuit connected to the first vertical signal line; and a second zero reset signal generation circuit connected to the second vertical signal line. The first zero reset signal generation circuit and the second zero reset signal generation circuit are connected to the same control line, and a depth value corresponding to a distance to a subject is calculated in accordance with a difference between the first detection signal and the second detection signal.

In the fourth form of an embodiment of the present technology, a pixel including a first tap that detects a charge photoelectrically converted by a photoelectric conversion unit and a second tap that detects a charge photoelectrically converted by the photoelectric conversion unit is provided; a first detection signal detected by the first tap and a reference signal are compared in a first comparison circuit, and a second detection signal detected by the second tap and the reference signal are compared in a second comparison circuit; the first detection signal of the pixel is transmitted to the first comparison circuit by a first vertical signal line, and the second detection signal of the pixel is transmitted to the second comparison circuit by a second vertical signal line; a first zero reset signal generation circuit connected to the first vertical signal line and a second zero reset signal generation circuit connected to the second vertical signal line are connected to the same control line; a depth value corresponding to the distance to a subject is calculated in accordance with the difference between the first detection signal and the second detection signal.

The light receiving device and the electronic apparatus may be independent devices, or may be modules to be incorporated into other devices.

According to the first to fourth forms of an embodiment of the present technology, distance information with suppressed element variation can be generated.

The effects described in the specification are not limiting. That is, the present disclosure can exhibit any of the effects that are described in the present disclosure.

DETAILED DESCRIPTION OF THE EMBODIMENT(S)

Hereinbelow, forms for implementing the present technology (hereinafter, referred to as embodiments) are described. Note that the description is given in the following order.
1. First embodiment of light receiving device
2. Second embodiment of light receiving device
3. Modification examples
4. Configuration example of ranging module
5. Configuration example of electronic apparatus
6. Example of application to mobile object
<1. First Embodiment of Light Receiving Device>
<Configuration Example of Light Receiving Device>

Figure 1:
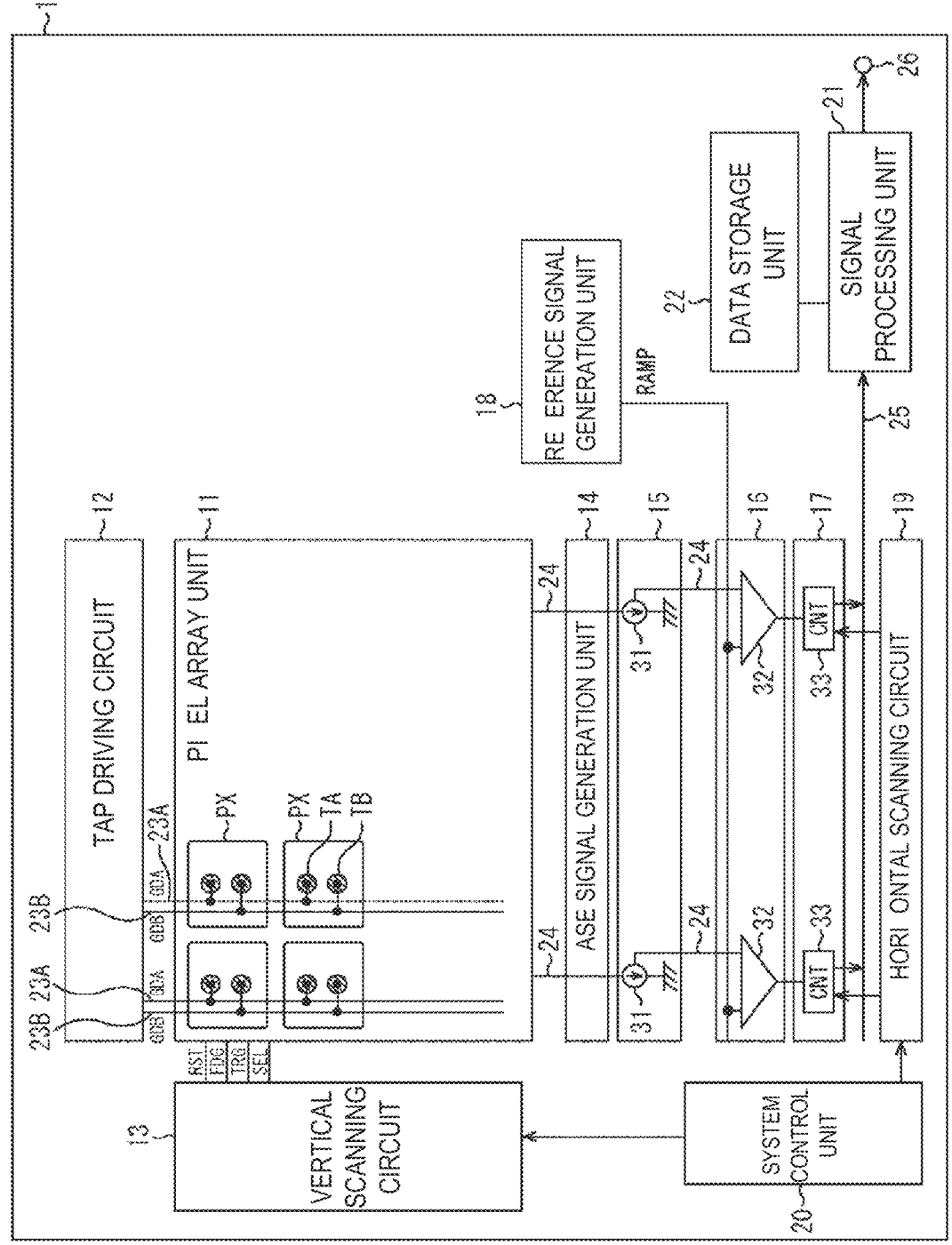
FIG. 1 is a block diagram showing a configuration example of a first embodiment of a light receiving device to which an embodiment of the present technology is applied.

FIG. 1 is a block diagram showing a configuration example of a first embodiment of a light receiving device to which an embodiment of the present technology is applied.

A light receiving device 1 shown in FIG. 1 is a device that receives reflected light of pulse light that is applied from a predetermined light source, is reflected at a subject, and has returned and that outputs distance measurement information based on an indirect ToF method. The light receiving device 1 includes a pixel array unit 11, a tap driving circuit 12, a vertical scanning circuit 13, a base signal generation unit 14, a constant current source circuit unit 15, a comparison circuit unit 16, a counter unit 17, a reference signal generation unit 18, a horizontal scanning circuit 19, a system control unit 20, a signal processing unit 21, a data storage unit 22, etc.

The pixel array unit 11 has a configuration in which pixels PX each of which receives reflected light of pulse light that is applied from a predetermined light source, is reflected at a subject, and has returned are two-dimensionally arranged in a matrix configuration in a row direction and a column direction. Here, the row direction refers to the arrangement direction of pixels PX in the horizontal direction (a pixel row), and the column direction refers to the arrangement direction of pixels PX in the vertical direction (a pixel column). In the pixel array unit 11, for example, 480 pixels PX are arranged in the vertical direction, and 640 pixels PX in the horizontal direction. The pixel PX receives light incident from the outside, in particular, infrared light, performs photoelectric conversion on the received light, and outputs a detection signal VSL according to a charge obtained as a result. The pixel PX has a first tap TA that detects a charge obtained by the photoelectric conversion by applying a predetermined voltage GDA (first voltage), and a second tap TB that detects a charge obtained by the photoelectric conversion by applying a predetermined voltage GDB (second voltage).

The tap driving circuit 12 supplies a predetermined voltage GDA to the first tap TA of each pixel PX of the pixel array unit 11 via a control line 23A, and supplies a predetermined voltage GDB to the second tap TB via a control line 23B.

The vertical scanning circuit 13 includes a shift register, an address decoder, etc., and drives each pixel PX of the pixel array unit 11 on a simultaneously-for-all-pixels basis, on a row basis, etc. Although a detailed circuit of the pixel PX is described later, the vertical scanning circuit 13 supplies, to each pixel PX, a reset driving signal RST, an FD driving signal FDG, a transfer driving signal TRG, and a selection signal SEL.

The base signal generation unit 14 generates a zero reset signal in the event in which the comparison circuit unit 16 performs an auto zero operation, and supplies the zero reset signal to the comparison circuit unit 16.

The constant current source circuit unit 15 includes a plurality of constant current sources 31, and one constant current source 31 is connected to one vertical signal line 24. The constant current source 31 forms a source follower circuit along with a transistor in the pixel PX connected via the vertical signal line 24.

The comparison circuit unit 16 includes a plurality of comparison circuits 32, and one comparison circuit 32 is connected to one vertical signal line 24. The comparison circuit 32 compares a reference signal RAMP supplied from the reference signal generation unit 18 and a detection signal VSL that is an output from the pixel PX.

The counter unit 17 includes a plurality of counters (CNT) 33 each of which performs counting on the basis of the comparison result of the comparison circuit 32. The comparison circuit unit 16 and the counter unit 17 constitute an analog-digital converter (ADC).

The reference signal generation unit 18 generates a reference signal RAMP for comparison with a detection signal VSL from the pixel PX, and supplies the reference signal RAMP to the comparison circuit 32 of the comparison circuit unit 16. The reference signal RAMP is a signal of which the level (voltage) changes in a staircase form in accordance with the lapse of time.

The horizontal scanning circuit 19 includes a shift register, an address decoder, etc.; and sequentially selects a plurality of counters 33 of the counter unit 17, and outputs a detection signal VSL after A/D conversion temporarily held in the counter 33 to the signal processing unit 21 via a horizontal signal line 25.

The system control unit 20 includes a timing generator or the like that generates various timing signals, and performs the driving control of the vertical scanning circuit 13, the base signal generation unit 14, the constant current source circuit unit 15, the comparison circuit unit 16, the counter unit 17, etc. on the basis of various timings generated by the timing generator.

The signal processing unit 21 has at least an arithmetic processing function, and performs various pieces of signal processing on the basis of a detection signal VSL outputted from the counter 33 of the counter unit 17. For example, the signal processing unit 21 calculates information of the distance to a subject from the difference between a detection signal VSL of the first tap TA and a detection signal VSL of the second tap TB of each pixel PX, and causes the distance information to be outputted from an output terminal 26. In the event of signal processing in the signal processing unit 21, the data storage unit 22 temporarily stores data necessary for the processing.

The light receiving device 1 described above outputs a depth image stored in each pixel, using information of the distance to a subject as a depth value. The light receiving device 1 is mounted in a vehicle, for example, and may be mounted in a system for a vehicle that measures the distance to an object existing outside the vehicle or in a device or the like for gesture recognition that measures the distance to an object such as a user's hand and recognizes a gesture of the user on the basis of the measurement result.

<Structure Example of Pixel>

Next, the structure of the pixel PX provided in the pixel array unit 11 is described.

Figure 2:
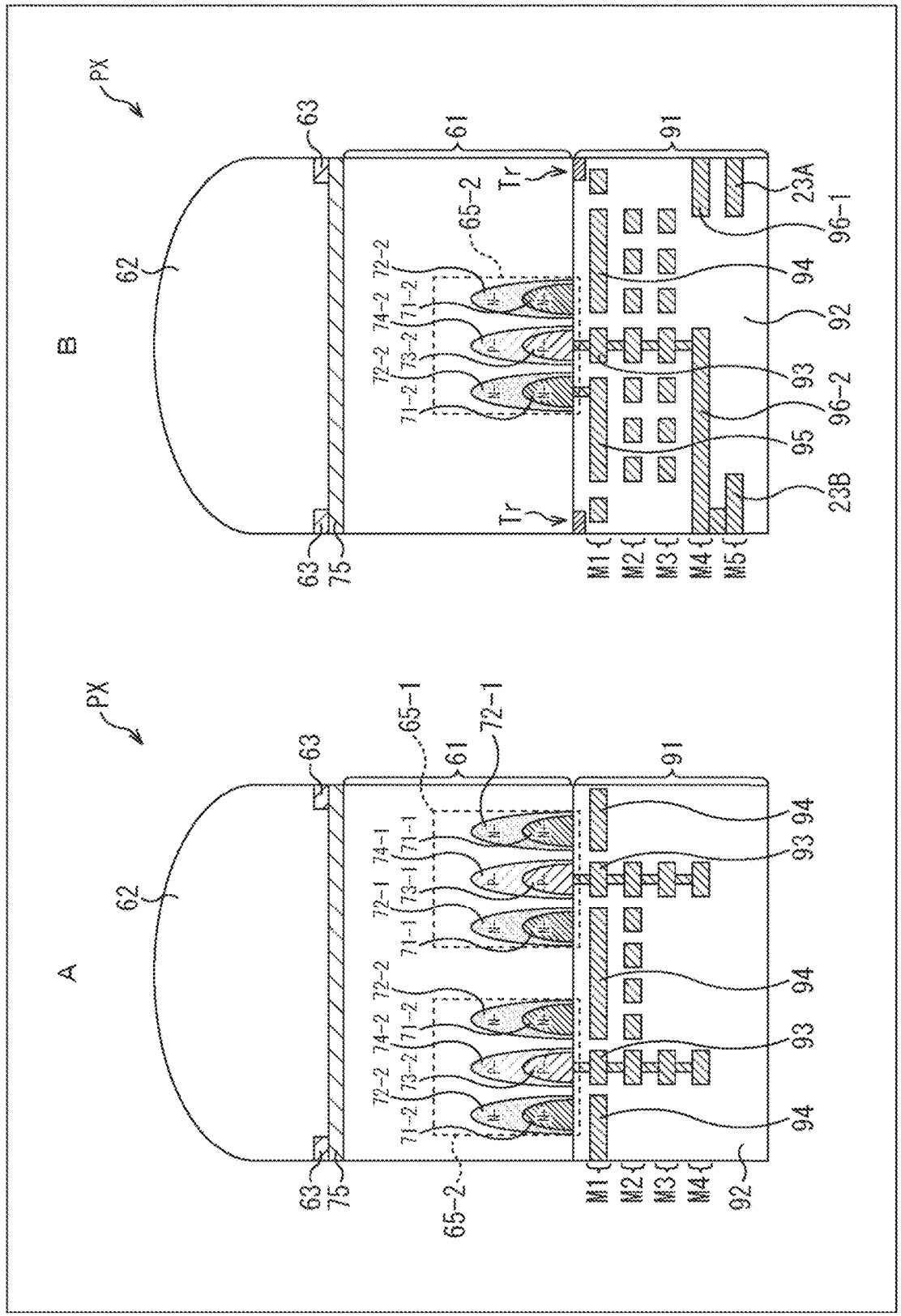
FIG. 2 is cross-sectional views of a pixel provided in a pixel array unit.
Figure 3:
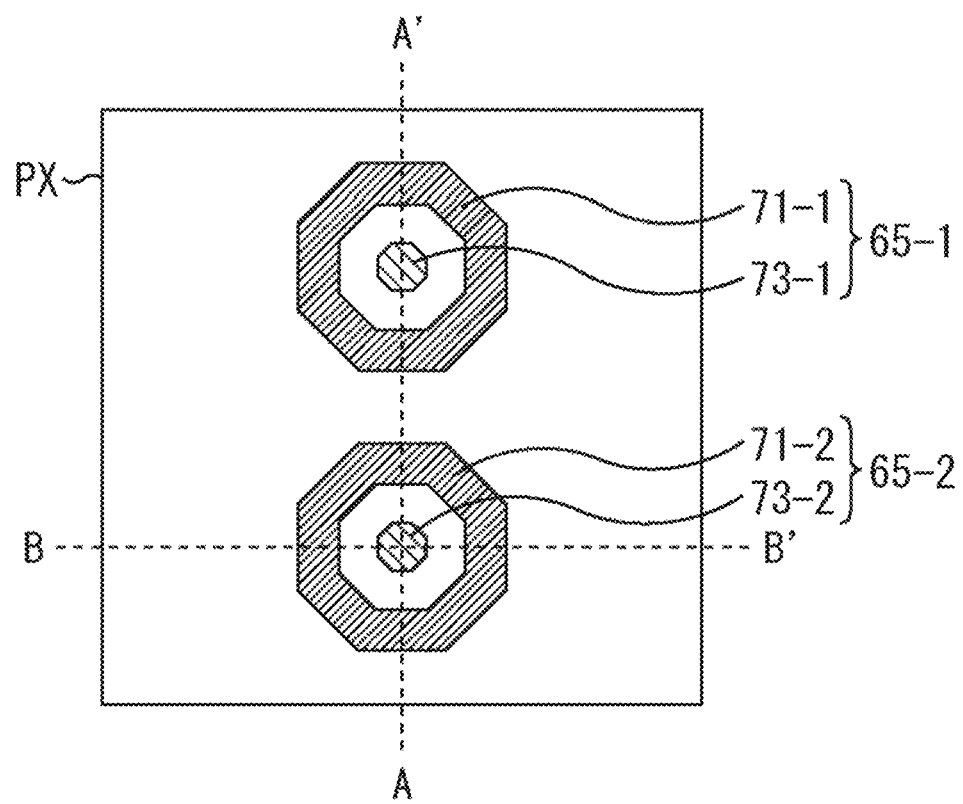
FIG. 3 is a plan view of a pixel provided in a pixel array unit.

FIG. 2 shows cross-sectional views of one pixel PX provided in the pixel array unit 11, and FIG. 3 shows a plan view of the pixel PX. A of FIG. 2 shows a cross-sectional view taken along the A-A' line of FIG. 3, and B of FIG. 2 shows a cross-sectional view taken along the B-B' line of FIG. 3.

As illustrated in FIG. 2, the pixel PX has a semiconductor substrate 61 including a silicon substrate, specifically a P-type semiconductor layer, for example, and an on-chip lens 62 formed on the semiconductor substrate 61.

A thickness of the semiconductor substrate 61 in a vertical direction in the drawing, that is, the thickness in a direction perpendicular to a surface of the semiconductor substrate 61, is formed to be 20 µm or less, for example. Note that it is a matter of course that the thickness of the semiconductor substrate 61 may be 20 µm or more, and it is sufficient if the thickness of the semiconductor substrate 61 is determined according to a targeted characteristic and the like of the light receiving device 1.

In addition, the semiconductor substrate 61 is a P-Epi substrate or the like having a high resistance, for example, having a substrate concentration on the order of 1E+13 or less, and the resistance (resistivity) of the semiconductor substrate 61 is formed to be, for example, 500 [Ωcm] or more.

Here, a relationship between the substrate concentration and the resistance of the semiconductor substrate 61 is, for example, a resistance of 2000 [Ωcm] when the substrate concentration is 6.48E+12 [cm$^3$], a resistance of 1000 [Ωcm] when the substrate concentration is 1.30E+13 [cm$^3$], a resistance of 500 [Ωcm] when the substrate concentration is 2.59E+13 [cm$^3$], a resistance of 100 [Ωcm] when the substrate concentration is 1.30E+14 [cm$^3$], and the like.

In the drawing of the semiconductor substrate 61, the surface on the upper side is a surface on the side where reflected light is caused to be incident (hereinafter, also referred to as a light incident surface), and an on-chip lens 62 that condenses reflected light injected from the outside and causes the light to be injected into the semiconductor substrate 61 is formed on the light incident surface.

Further, an inter-pixel light blocking film 63 for preventing color mixing between adjacent pixels is formed in a boundary portion of the pixel PX on the light incident surface of the semiconductor substrate 61. The inter-pixel light blocking film 63 prevents light injected in the pixel PX from being injected into another pixel PX provided adjacently.

A signal extraction unit 65-1 and a signal extraction unit 65-2 are formed on the surface opposite to the light incident surface in the semiconductor substrate 61, that is, in an inside portion of the lower surface in the figure. The signal extraction unit 65-1 corresponds to the first tap TA illustrated in FIG. 1, and the signal extraction unit 65-2 corresponds to the second tap TB illustrated in FIG. 1.

The signal extraction unit 65-1 has an N+ semiconductor region 71-1 and an N− semiconductor region 72-1 having a donor impurity concentration lower than that of the N+ semiconductor region 71-1 which are an N type semiconductor region, and a P+ semiconductor region 73-1 and a P− semiconductor region 74-1 having an acceptor impurity concentration lower than that of the P+ semiconductor region 73-1 which are a P type semiconductor region. Here, an example of a donor impurity with respect to Si may include an element belonging to group 5 in the periodic table of the elements, such as phosphorus (P) or arsenic (As), and an example of an acceptor impurity with respect to Si may include an element belonging to group 3 in the periodic table of the elements, such as boron (B). An element serving as the donor impurity is referred to as a donor element, and an element serving as the acceptor impurity is referred to as an acceptor element.

The N− semiconductor region 72-1 is formed on the upper side of the N+ semiconductor region 71-1 so as to cover (surround) the N+ semiconductor region 71-1. Similarly, the P− semiconductor region 74-1 is formed on the upper side of the P+ semiconductor region 73-1 so as to cover (surround) the P+ semiconductor region 73-1.

In a planar view, as shown in FIG. 3, the N+ semiconductor region 71-1 is formed so as to surround the periphery of the P+ semiconductor region 73-1 about the P+ semiconductor region 73-1. Also the N− semiconductor region 72-1 formed on the upper side of the N+ semiconductor region 71-1 is similarly formed so as to surround the periphery of the P− semiconductor region 74-1 about the P− semiconductor region 74-1.

Similarly, the signal extraction unit 65-2 in FIG. 2 has an N+ semiconductor region 71-2 and an N− semiconductor region 72-2 having a donor impurity concentration lower than that of the N+ semiconductor region 71-2 which are an N type semiconductor region, and a P+ semiconductor region 73-2 and a P− semiconductor region 74-2 having an acceptor impurity concentration lower than that of the P+ semiconductor region 73-2 which are a P type semiconductor region.

The N− semiconductor region 72-2 is formed on the upper side of the N+ semiconductor region 71-2 so as to cover (surround) the N+ semiconductor region 71-2. Similarly, the P− semiconductor region 74-2 is formed on the upper side of the P+ semiconductor region 73-2 so as to cover (surround) the P+ semiconductor region 73-2.

In a planar view, as shown in FIG. 3, the N+ semiconductor region 71-2 is formed so as to surround the periphery of the P+ semiconductor region 73-2 about the P+ semiconductor region 73-2. Also the N− semiconductor region 72-2 formed on the upper side of the N+ semiconductor region 71-2 is similarly formed so as to surround the periphery of the P− semiconductor region 74-2 about the P− semiconductor region 74-2.

Hereinafter, in a case in which it is not necessary to particularly distinguish between the signal extraction unit 65-1 and the signal extraction unit 65-2, the signal extraction unit 65-1 and the signal extraction unit 65-2 are also simply referred to as a signal extraction unit 65.

In addition, hereinafter, in a case in which it is not necessary to particularly distinguish between the N+ semiconductor region 71-1 and the N+ semiconductor regions 71-2, the N+ semiconductor region 71-1 and the N+ semiconductor regions 71-2 are also simply referred to as an N+ semiconductor region 71, and in a case in which it is not necessary to particularly distinguish between the N− semiconductor region 72-1 and the N− semiconductor region 72-2, the N− semiconductor region 72-1 and the N− semiconductor region 72-2 are also simply referred to as an N− semiconductor region 72.

Furthermore, hereinafter, in a case in which it is not necessary to particularly distinguish between the P+ semiconductor region 73-1 and the P+ semiconductor region 73-2, the P+ semiconductor region 73-1 and the P+ semiconductor region 73-2 are also simply referred to as a P+ semiconductor region 73, and in a case in which it is not necessary to particularly distinguish between the P− semiconductor region 74-1 and the P− semiconductor region 74-2, the P− semiconductor region 74-1 and the P− semiconductor region 74-2 are also simply referred to as a P− semiconductor region 74.

A fixed charge film 75 including one layer of film or a stacked film having a positive fixed charge is formed on the interface on the light incident surface side of the semiconductor substrate 61. The fixed charge film 75 suppresses the occurrence of dark current on the incident surface side of the semiconductor substrate 61.

On the other hand, a multilayer interconnection layer 91 is formed on the opposite side to the light incident surface side of the semiconductor substrate 61 on which the on-chip lens 62 is formed for each pixel. In other words, a semiconductor substrate 61 that is a semiconductor layer is placed between the on-chip lens 62 and the multilayer interconnection layer 91. The multilayer interconnection layer 91 includes five metal films M1 to M5 and an interlayer insulating film 92 between them. Note that the metal film M5 on the outermost side among the five metal films M1 to M5 of the multilayer interconnection layer 91 is not shown in A of FIG. 2 because it is in an invisible place, but is shown in B of FIG. 2.

The metal film M1 nearest to the semiconductor substrate 61 among the five metal films M1 to M5 of the multilayer interconnection layer 91 includes a voltage application interconnection 93 for applying a predetermined voltage GDA or GDB to the P+ semiconductor region 73-1 or 73-2 and a reflection member 94 that is a member that reflects incident light.

Figure 4:
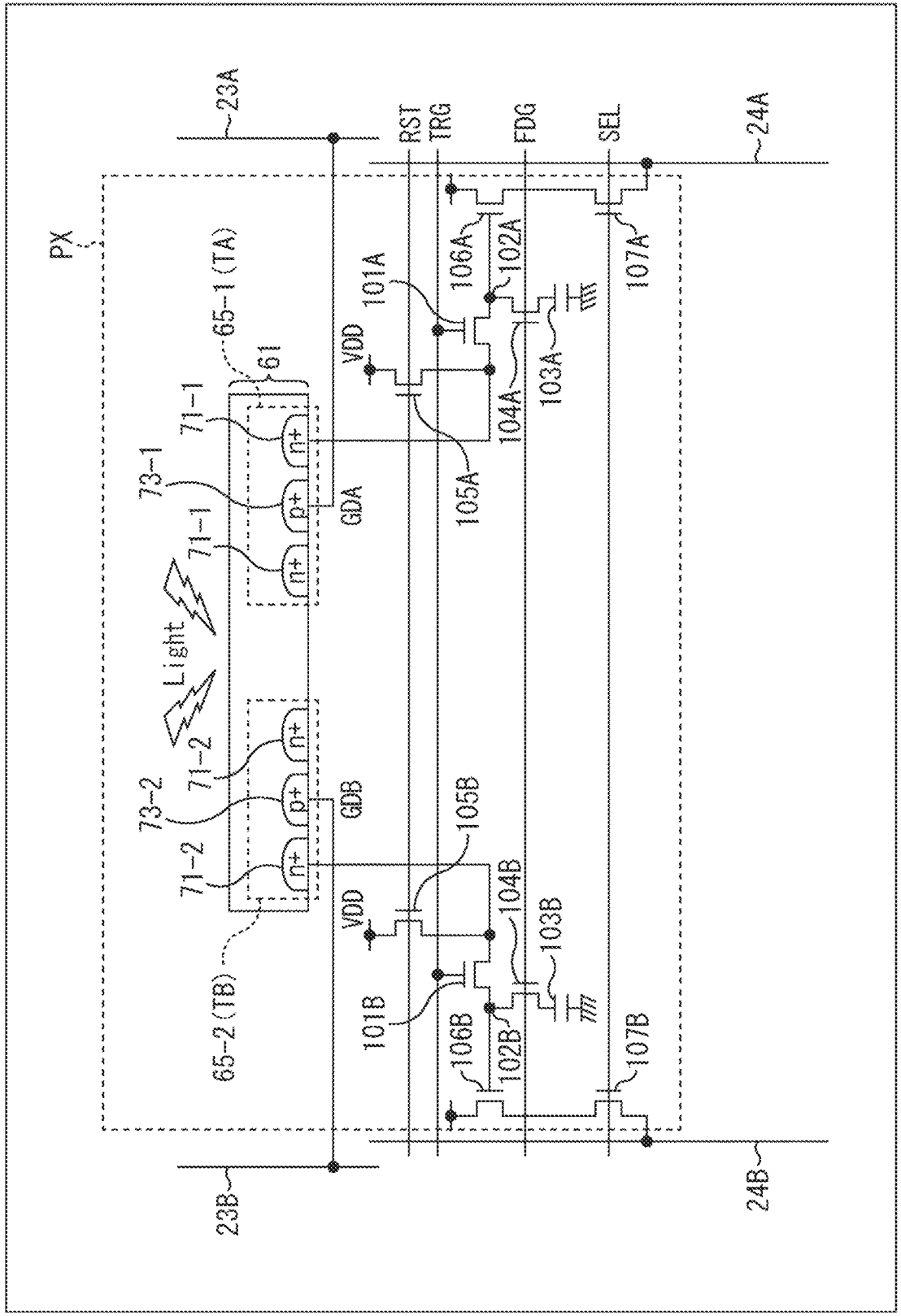
FIG. 4 is a diagram showing an equivalent circuit of a pixel.

Further, in addition to the voltage application interconnection 93 for applying a predetermined voltage GDA or GDB to the P+ semiconductor region 73 as a voltage application unit, a signal extraction interconnection 95 connected to part of the N+ semiconductor region 71, which is a charge detection unit, is formed in the metal film M1. The signal extraction interconnection 95 transmits a charge detected by the N+ semiconductor region 71 to an FD 102 (FIG. 4).

As shown in B of FIG. 2, the signal extraction unit 65-2 (the second tap TB) is connected to the voltage application interconnection 93 of the metal film M1, and the voltage application interconnection 93 is electrically connected to an interconnection 96-2 of the metal film M4 via a via. The interconnection 96-2 of the metal film M4 is connected to the control line 23B of the metal film M5 via a via, and the control line 23B of the metal film M5 is connected to the tap driving circuit 12. Thereby, a predetermined voltage GDB is supplied from the tap driving circuit 12 to the P+ semiconductor region 73-2 as a voltage application unit via the control line 23B of the metal film M5, the interconnection 96-2 of the metal film M4, and the voltage application interconnection 93.

Similarly, in a not-illustrated region of the pixel PX, a predetermined voltage GDA is supplied from the tap driving circuit 12 to the P+ semiconductor region 73-1 as a voltage application unit of the signal extraction unit 65-1 (the first tap TA) via the control line 23A of the metal film M5, an interconnection 96-1 of the metal film M4, and the voltage application interconnection 93.

As above, in the light receiving device 1 of FIG. 1, the light incident surface of the semiconductor substrate 61 is what is called the back surface on the opposite side to the multilayer interconnection layer 91 side; thus, the light receiving device 1 has a back-side illumination current assisted photonic demodulator (CAPD) structure.

The N+ semiconductor region 71 provided on the semiconductor substrate 61 functions as a charge detection unit for detecting a light amount of the light incident on the pixel PX from the outside, that is, an amount of a signal carrier generated by the photoelectric conversion by the semiconductor substrate 61. Note that, in addition to the N+ semiconductor region 71, the N− semiconductor region 72 having a low donor impurity concentration is also able to be regarded as the charge detection unit.

In addition, the P+ semiconductor region 73 functions as a voltage applying unit for injecting a majority carrier current into the semiconductor substrate 61, that is, applying a voltage directly to the semiconductor substrate 61 to generate an electric field in the semiconductor substrate 61. Note that, in addition to the P+ semiconductor region 73, the P− semiconductor region 74 having a low acceptor impurity concentration is also able to be regarded as a voltage applying unit.

In the planar view of FIG. 3, the signal extraction unit 65 has the P+ semiconductor region 73 as a voltage application unit placed at the center and the N+ semiconductor region 71 as a charge detection unit placed so as to surround the periphery of the P+ semiconductor region 73.

As shown in FIG. 3, the signal extraction units 65-1 and 65-2 are arranged in positions symmetrical with respect to a central portion of the pixel PX. Note that, although FIG. 3 shows an example in which the planar shape of each of the N+ semiconductor region 71 and the P+ semiconductor region 73 is an octagonal shape, the planar shape may be other planar shapes such as a square shape, a rectangular shape, and a circular shape.

<Equivalent Circuit Configuration Example of Pixel>

FIG. 4 shows an equivalent circuit of the pixel PX.

The pixel PX includes a transfer transistor 101A, an FD 102A, an additional capacitance 103A, a switching transistor 104A, a reset transistor 105A, an amplification transistor 106A, and a selection transistor 107A for the signal extraction unit 65-1 (the first tap TA) including the N+ semiconductor region 71-1, the P+ semiconductor region 73-1, etc.

Further, the pixel PX includes a transfer transistor 101B, an FD 102B, an additional capacitance 103B, a switching transistor 104B, a reset transistor 105B, an amplification transistor 106B, and a selection transistor 107B for the signal extraction unit 65-2 (the second tap TB) including the N+ semiconductor region 71-2, the P+ semiconductor region 73-2, etc.

Each of the transfer transistor 101 (101A and 101B), the switching transistor 104 (104A and 104B), the reset transistor 105 (105A and 105B), the amplification transistor 106 (106A and 106B), and the selection transistor 107 (107A and 107B) includes an N-type MOS transistor.

The tap driving circuit 12 applies a predetermined voltage GDA to the P+ semiconductor region 73-1, and applies a predetermined voltage GDB to the P+ semiconductor region 73-2. For example, one of the voltages GDA and GDB is 1.5 V, and the other is 0 V.

Each of the N+ semiconductor regions 71-1 and 71-2 is a charge detection unit that detects and accumulates a charge generated by light injected in the semiconductor substrate 61 being photoelectrically converted.

If a transfer driving signal TRG supplied to the gate electrode of the transfer transistor 101A enters an active state, the transfer transistor 101A enters a conduction state in response to this, and thereby transfers the charge accumulated in the N+ semiconductor region 71-1 to the FD 102A. If a transfer driving signal TRG supplied to the gate electrode of the transfer transistor 101B enters an active state, the transfer transistor 101B enters a conduction state in response to this, and thereby transfers the charge accumulated in the N+ semiconductor region 71-2 to the FD 102B.

The FD 102A temporarily retains the charge supplied from the N+ semiconductor region 71-1. The FD 102B temporarily retains the charge supplied from the N+ semiconductor region 71-2.

If an FD driving signal FDG supplied to the gate electrode of the switching transistor 104A enters an active state, the switching transistor 104A enters a conduction state in response to this, and thereby causes the additional capacitance 103A to be connected to the FD 102A. If an FD driving signal FDG supplied to the gate electrode of the switching transistor 104B enters an active state, the switching transistor 104B enters a conduction state in response to this, and thereby causes the additional capacitance 103B to be connected to the FD 102B.

At the time of, for example, high illuminance in which the amount of incident light is large, the vertical scanning circuit 13 brings the switching transistors 104A and 104B into an active state to connect the FD 102A and the additional capacitance 103A and connect the FD 102B and the additional capacitance 103B. Thereby, a larger amount of charge can be accumulated at the time of high illuminance.

On the other hand, at the time of low illuminance in which the amount of incident light is small, the vertical scanning circuit 13 brings the switching transistors 104A and 104B into an inactive state to separate the additional capacitances 103A and 103B from the FDs 102A and 102B, respectively. Thereby, conversion efficiency can be increased.

If a reset driving signal RST supplied to the gate electrode of the reset transistor 105A enters an active state, the reset transistor 105A enters a conduction state in response to this, and thereby resets the electric potential of the FD 102A to a predetermined level (a reset voltage VDD). If a reset driving signal RST supplied to the gate electrode of the reset transistor 105B enters an active state, the reset transistor 105B enters a conduction state in response to this, and thereby resets the electric potential of the FD 102B to a predetermined level (a reset voltage VDD). Note that, when the reset transistors 105A and 105B are brought into an active state, also the transfer transistors 101A and 101B are simultaneously brought into an active state.

The amplification transistor 106A forms a source follower circuit along with the constant current source 31 of the constant current source circuit unit 15 by the source electrode of the amplification transistor 106A being connected to a vertical signal line 24A via the selection transistor 107A. The amplification transistor 106B forms a source follower circuit along with the constant current source 31 of the constant current source circuit unit 15 by the source electrode of the amplification transistor 106B being connected to a vertical signal line 24B via the selection transistor 107B.

The selection transistor 107A is connected between the source electrode of the amplification transistor 106A and the vertical signal line 24A. If a selection signal SEL supplied to the gate electrode of the selection transistor 107A enters an active state, the selection transistor 107A enters a conduction state in response to this, and outputs a detection signal VSL outputted from the amplification transistor 106A to the vertical signal line 24A.

The selection transistor 107B is connected between the source electrode of the amplification transistor 106B and the vertical signal line 24B. If a selection signal SEL supplied to the gate electrode of the selection transistor 107B enters an active state, the selection transistor 107B enters a conduction state in response to this, and outputs a detection signal VSL outputted from the amplification transistor 106B to the vertical signal line 24B.

The transfer transistors 101A and 101B, the reset transistors 105A and 105B, the amplification transistors 106A and 106B, and the selection transistors 107A and 107B of the pixel PX are controlled by the vertical scanning circuit 13.

In the equivalent circuit of FIG. 4, the additional capacitances 103A and 103B and the switching transistors 104A and 104B that control the connection of them may be omitted, but a high dynamic range can be ensured by providing the additional capacitances 103 and using them differently in accordance with the amount of incident light.

<Charge Detection Operation of Pixel>

A detection operation of the pixel PX is described with reference to FIG. 2 and FIG. 4.

In a case of attempting to measure the distance to the object by an indirect ToF method, for example, infrared light is emitted from the imaging apparatus provided with the light receiving device 1 toward the object. In addition, in a case in which the infrared light is reflected by the object and returns to the imaging apparatus as reflected light, the light receiving device 1 receives the reflected light (infrared light) incident thereon and performs photoelectric conversion.

In this event, the tap driving circuit 12 causes the pixel PX to be driven, and distributes charges obtained by photoelectric conversion to the FD 102A connected to the N+ semiconductor region 71-1, which is one charge detection unit (a first charge detection unit), and the FD 102B connected to the N+ semiconductor region 71-2, which is the other charge detection unit (a second charge detection unit).

More specifically, at a certain timing, the tap driving circuit 12 applies predetermined voltages to the two P+ semiconductor regions 73 via the voltage application interconnections 93 etc. For example, the tap driving circuit 12 applies a voltage of 1.5 V to the P+ semiconductor region 73-1, and applies a voltage of 0 V to the P+ semiconductor region 73-2.

Then, an electric field is generated between the two P+ semiconductor regions 73 in the semiconductor substrate 61, and a current flows from the P+ semiconductor region 73-1 to the P+ semiconductor region 73-2. In this case, a hole in the semiconductor substrate 61 moves toward the P+ semiconductor region 73-2, and an electron moves toward the P+ semiconductor region 73-1.

Therefore, in such a state, in a case in which the infrared light (reflected light) from the outside enters the inside of the semiconductor substrate 61 through the on-chip lens 62, and the photoelectric conversion is performed on the infrared light in the semiconductor substrate 61 to convert the infrared light into pairs of electrons and holes, the obtained electrons are guided toward the P+ semiconductor region 73-1 by the electric field between the P+ semiconductor regions 73, and are moved to the N+ semiconductor region 71-1.

In this case, the electrons generated by the photoelectric conversion are used as the signal carrier for detecting the signal according to an amount of the infrared light incident on the pixels PX, that is, a reception light amount of the infrared light.

Thereby, a charge in accordance with electrons that have moved into the N+ semiconductor region 71-1 is detected in the N+ semiconductor region 71-1, and is accumulated in the FD 102A. In a case where the switching transistor 104A is in an active state, a charge is accumulated also in the additional capacitance 103A. In a case where the pixel PX is selected, a signal in accordance with this charge is outputted to the comparison circuit 32 of the comparison circuit unit 16 via the vertical signal line 24A etc.

Then, the read signal is subjected to A/D conversion processing in the comparison circuit 32 of the comparison circuit unit 16 and the counter 33 of the counter unit 17, and the resulting A/D converted value of the detection signal VSL is supplied to the signal processing unit 21. The A/D converted value of the detection signal VSL is a value indicating the amount of charge detected by the N+ semiconductor region 71-1, in other words, the amount of infrared light received by the pixel PX.

Note that, at this time, a signal according to the charges detected in the N+ semiconductor region 71-2 is also able to be used for appropriate distance measurement, similarly to a case of the N+ semiconductor region 71-1.

Further, at the next timing, voltages are applied to the two P+ semiconductor regions 73 by the tap driving circuit 12 in such a manner that an electric field in the opposite direction to the electric field that has so far been generated in the semiconductor substrate 61 is generated. Specifically, for example, a voltage of 0 V is applied to the P+ semiconductor region 73-1, and a voltage of 1.5 V is applied to the P+ semiconductor region 73-2.

Therefore, an electric field is generated between the two P+ semiconductor regions 73 in the semiconductor substrate 61, and a current flows from the P+ semiconductor region 73-2 to the P+ semiconductor region 73-1.

In such a state, in a case in which the infrared light (reflected light) from the outside enters the inside of the semiconductor substrate 61 through the on-chip lens 62, and the photoelectric conversion is performed on the infrared light in the semiconductor substrate 61 to convert the infrared light into a pair of the electron and the hole, the obtained electron is directed in the direction of P+ semiconductor region 73-2 by the electric field between the P+ semiconductor regions 73, and is moved into the N+ semiconductor region 71-2.

Thereby, a charge in accordance with electrons that have moved into the N+ semiconductor region 71-2 is detected in the N+ semiconductor regions 71-2, and is accumulated in the FD 102B. In a case where the switching transistor 104B is in an active state, a charge is accumulated also in the additional capacitance 103B. In a case where the pixel PX is selected, a signal in accordance with this charge is outputted to the comparison circuit 32 of the comparison circuit unit 16 via the vertical signal line 24B etc.

Then, the read signal is subjected to A/D conversion processing in the comparison circuit 32 of the comparison circuit unit 16 and the counter 33 of the counter unit 17, and the resulting A/D converted value of the detection signal VSL is supplied to the signal processing unit 21. The A/D converted value of the detection signal VSL is a value indicating the amount of charge detected by the N+ semiconductor region 71-2, in other words, the amount of infrared light received by the pixel PX.

Note that, at this time, a signal according to the electron detected in the N+ semiconductor region 71-1 is also able to be used for appropriate distance measurement, similarly to a case of the N+ semiconductor region 71-2.

As described above, in a case in which the detection signal VSL obtained by the photoelectric conversion of periods different from each other in the same pixel PX are obtained, the signal processing unit 21 calculates distance information indicating the distance to the object on the basis of the detection signal VSL and outputs the distance information to the subsequent stage.

A method of distributing the signal carriers to the N+ semiconductor regions 71 different from each other and calculating the distance information on the basis of the signal according to the signal carrier as described above is referred to as an indirect ToF method.

Here, the signal extraction unit 65 in which the reading of the signal according to the charge (electron) that is obtained by the photoelectric conversion is to be performed, that is, the signal extraction unit 65 in which the charge obtained by the photoelectric conversion is to be detected will be referred to as an active tap.

On the contrary, basically, the signal extraction unit 65 in which the reading of the signal according to the charge that is obtained by the photoelectric conversion is not to be performed, that is, the signal extraction unit 65 that is not the active tap will be referred to as an inactive tap.

In the above example, the signal extraction unit 65 in which a voltage of 1.5 V is applied to the P+ semiconductor region 73 is the active tap, and the signal extraction unit 65 in which a voltage of 0 V is applied to the P+ semiconductor region 73 is the inactive tap.

For a CAPD sensor, there is a value called Cmod (contrast between active and inactive taps) serving as an index of distance measurement accuracy. Cmod is calculated by Math. (1) below. In Math. (1), I0 is a signal detected in one of two charge detection units (P+ semiconductor regions 73), and I1 is a signal detected in the other of the two charge detection units.

$$Cmod=\{|I0-I1|/(I0+I1)\}\times 100 \qquad (1)$$

Cmod indicates that what % of the charge is able to be detected in the N+ semiconductor region 71 of the signal extraction unit 65 that is the active tap, among the charges generated by the photoelectric conversion of the incident infrared light, that is, an index indicating whether or not it is possible to extract the signal according to the charge, and indicates the charge separation efficiency.

Therefore, for example, in a case in which the infrared light incident from the outside is incident on a region of the inactive tap and the photoelectric conversion is performed in the inactive tap, there is a high likelihood that the electron that is the signal carrier generated by the photoelectric conversion will move to the N+ semiconductor region 71 in the inactive tap. Therefore, a charge of a part of the electron obtained by the photoelectric conversion is not detected in the N+ semiconductor region 71 in the active tap, and Cmod, that is, the charge separation efficiency, is reduced.

Therefore, in the pixel PX, the infrared light is condensed in the vicinity of the central portion of the pixel PX positioned at substantially the same distance from the two signal extraction units 65, so that a possibility that the photoelectric conversion will be performed on the infrared light incident from the outside in the region of the inactive tap is reduced. Thus, it is possible to improve the charge separation efficiency.

<Circuit Configuration Example of Pixel Array Unit>

Figure 5:
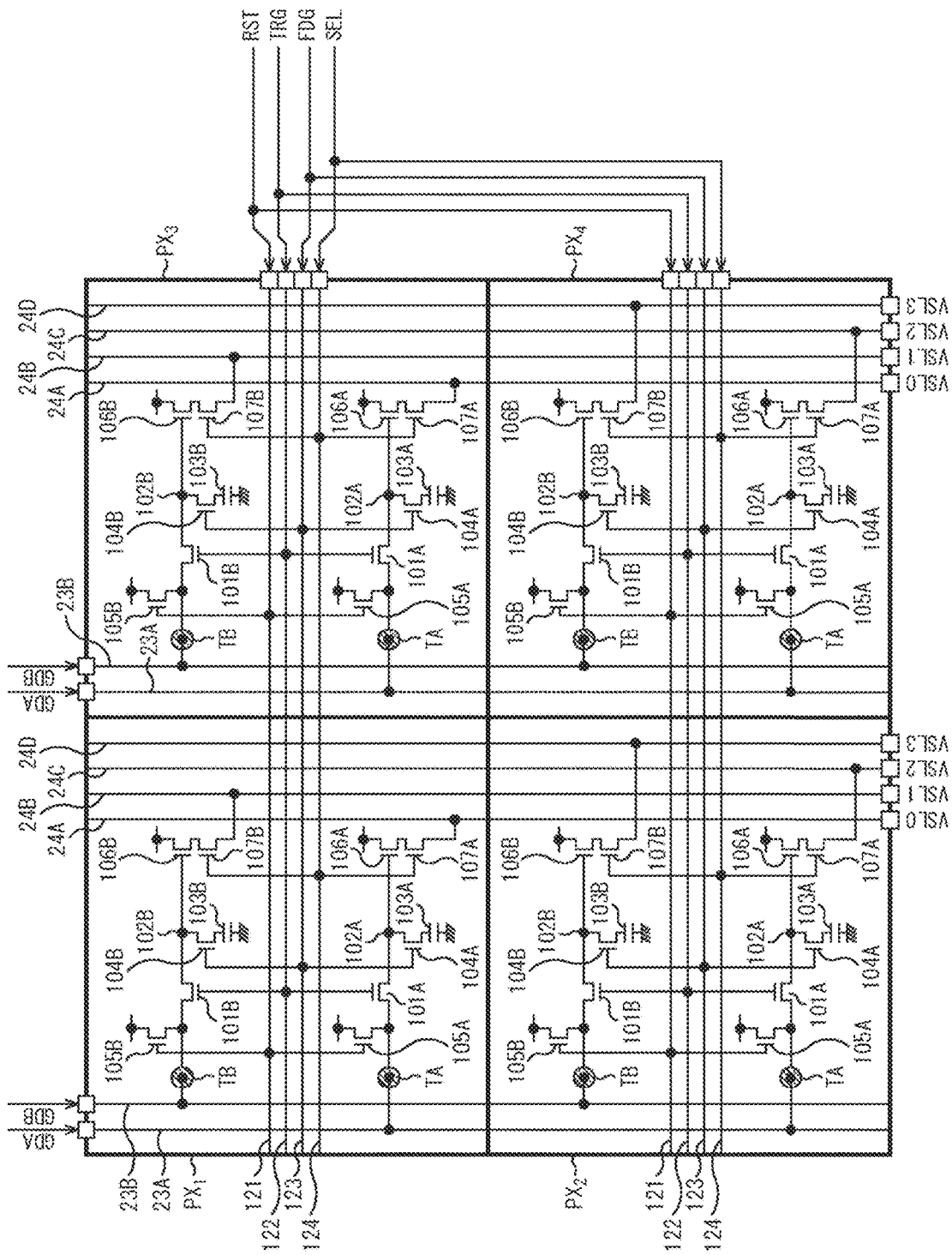
FIG. 5 is a diagram showing a circuit configuration example of a pixel array unit.

FIG. 5 shows a circuit configuration example of the pixel array unit 11. FIG. 5 shows a circuit configuration of four pixels of 2×2 among a plurality of pixels PX that is two-dimensionally arranged in a matrix configuration in the pixel array unit 11. Note that, in a case where four pixels PX of 2×2 are distinguished in FIG. 5, they are shown as pixels $PX_1$ to $PX_4$.

As described with reference to FIG. 4, each pixel PX includes a transfer transistor 101, an FD 102, an additional capacitance 103, a switching transistor 104, a reset transistor 105, an amplification transistor 106, and a selection transistor 107 for each of the first tap TA and the second tap TB.

In the vertical direction of the pixel array unit 11, control lines 23A and 23B are arranged in one pixel column. Then, a predetermined voltage GDA is supplied to the first tap TA of each of a plurality of pixels PX arranged in the column direction via the control line 23A, and a predetermined voltage GDB is supplied to the second tap TB via the control line 23B.

Further, four vertical signal lines 24A to 24D are arranged in one pixel column in the vertical direction of the pixel array unit 11.

In the pixel column of the pixels $PX_1$ and $PX_2$, for example, the vertical signal line 24A transmits a detection signal VSL0 of the first tap TA of the pixel $PX_1$ to the comparison circuit unit 16 (FIG. 1), the vertical signal line 24B transmits a detection signal VSL1 of the second tap TB of the pixel $PX_1$ to the comparison circuit unit 16, the vertical signal line 24C transmits a detection signal VSL2 of the first tap TA of the pixel $PX_2$ adjacent to the pixel $PX_1$ in the same column to the comparison circuit unit 16, and the vertical signal line 24D transmits a detection signal VSL3 of the second tap TB of the pixel $PX_2$ to the comparison circuit unit 16.

In the pixel column of the pixels $PX_3$ and $PX_4$, for example, the vertical signal line 24A transmits a detection signal VSL0 of the first tap TA of the pixel $PX_3$ to the comparison circuit unit 16 (FIG. 1), the vertical signal line 24B transmits a detection signal VSL1 of the second tap TB of the pixel $PX_3$ to the comparison circuit unit 16, the vertical signal line 24C transmits a detection signal VSL2 of the first tap TA of the pixel $PX_4$ adjacent to the pixel $PX_3$ in the same column to the comparison circuit unit 16, and the vertical signal line 24D transmits a detection signal VSL3 of the second tap TB of the pixel $PX_4$ to the comparison circuit unit 16.

On the other hand, in the horizontal direction of the pixel array unit 11, a control line 121 that transmits a reset driving signal RST, a control line 122 that transmits a transfer driving signal TRG, a control line 123 that transmits an FD driving signal FDG, and a control line 124 that transmits a selection signal SEL are arranged on a pixel row basis.

In regard to the reset driving signal RST, the FD driving signal FDG, the transfer driving signal TRG, and the selection signal SEL, the same signal is supplied to the pixels PX of two rows adjacent in the vertical direction from the vertical scanning circuit 13.

As above, the control lines 23A and 23B and the control lines 121 to 124 are arranged for each pixel PX of the pixel array unit 11.

The tap driving circuit 12 supplies a predetermined voltage GDA and a predetermined voltage GDB to the first taps TA and the second taps TB of all the pixels PX of the pixel array unit 11 in common. In other words, the timing at which charges are distributed to the FD 102A and the FD 102B of each pixel PX of the pixel array unit 11 is the same between all the pixels PX.

Then, the charges accumulated in the FD 102A and the FD 102B of each pixel PX of the pixel array unit 11 are sequentially read in units of two rows to the comparison circuit unit 16 by the control of the vertical scanning circuit 13.

<Detailed Configuration Example of Base Signal Generation Unit etc.>

Next, a detailed configuration example of the base signal generation unit 14, the constant current source circuit unit

15, the comparison circuit unit 16, and the counter unit 17 is described with reference to FIG. 6.

Figure 6:
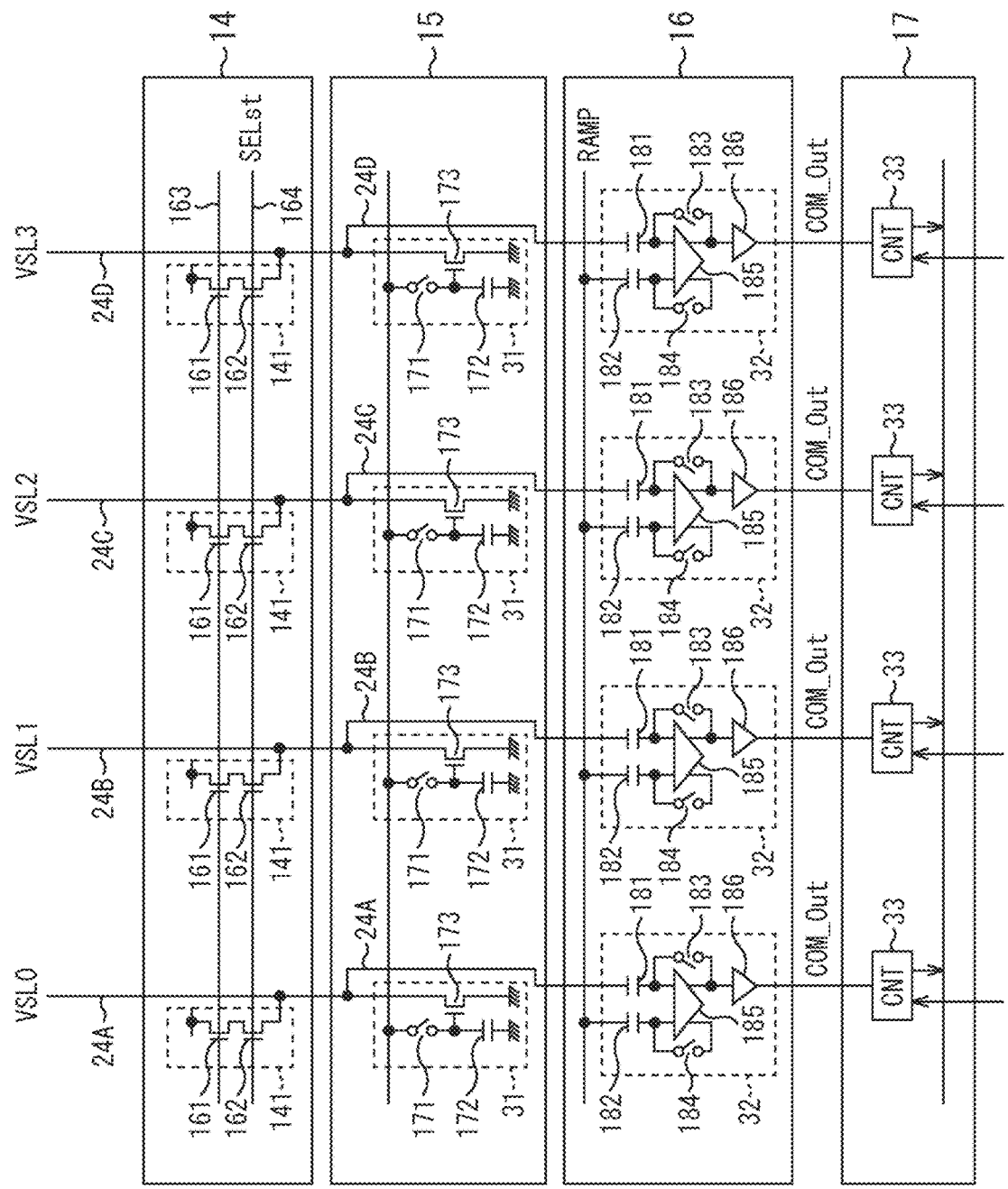
FIG. 6 is a diagram showing a detailed configuration example of a base level generation unit etc. of FIG. 1.

FIG. 6 shows a detailed configuration example of the base signal generation unit 14, the constant current source circuit unit 15, the comparison circuit unit 16, and the counter unit 17 corresponding to two pixels adjacent in the vertical direction, like the pixel $PX_1$ and the pixel $PX_2$, or the pixel $PX_3$ and the pixel $PX_4$ shown in FIG. 5.

As described above, two pixels PX adjacent in the vertical direction simultaneously output detection signals VSL0 to VSL3 via the vertical signal lines 24A to 24D.

The base signal generation unit 14 includes a plurality of base signal generation circuits 141, and the base signal generation circuit 141 is provided for the vertical signal line 24 on a one-to-one basis.

The base signal generation circuit 141 includes an amplification transistor 161 and a selection transistor 162 connected in series. Each of the amplification transistor 161 and the selection transistor 162 includes an N-type MOS transistor.

The amplification transistor 161 forms a source follower circuit along with the constant current source 31 of the constant current source circuit unit 15 by the source electrode of the amplification transistor 161 being connected to the vertical signal line 24 via the selection transistor 162. The amplification transistor 161 is set to ON in accordance with a control signal supplied to the gate electrode of the amplification transistor 161 via a control line 163. The control line 163 is connected to the gate electrode of the amplification transistor 161 of each base signal generation circuit 141 in the base signal generation unit 14.

The selection transistor 162 is connected between the source electrode of the amplification transistor 161 and the vertical signal line 24. If a selection signal $SEL_{st}$ supplied to the gate electrode of the selection transistor 162 via a control line 164 enters an active state, the selection transistor 162 enters a conduction state in response to this, and outputs a base signal $BSL_1$ outputted from the amplification transistor 161 to the vertical signal line 24. The control line 164 is connected to the gate electrode of the selection transistor 162 of each base signal generation circuit 141 in the base signal generation unit 14. The amplification transistor 161 and the selection transistor 162 are controlled by, for example, the system control unit 20.

By the control of the system control unit 20, the amplification transistor 161 and the selection transistor 162 are simultaneously set to ON in an auto zero period in which the comparison circuit unit 16 performs an auto zero operation. Thus, in the auto zero period, the base signal generation circuit 141 generates a base signal $BSL_1$ of a predetermined voltage, and supplies the base signal $BSL_1$ to the corresponding comparison circuit 32 in the comparison circuit unit 16. The base signal $BSL_1$ functions as a zero reset signal in the event in which the comparison circuit unit 16 performs the auto zero operation, and the base signal generation circuit 141 is equivalent to a zero reset signal generation circuit that generates a zero reset signal in the event of performing the auto zero operation.

The constant current source circuit unit 15 includes one constant current source 31 for one vertical signal line 24, and functions as a current source of a source follower circuit.

The constant current source 31 includes a switch 171, a capacitor (capacitance element) 172, and a load transistor 173. The switch 171 comes into conduction at a predetermined timing by the control of the system control unit 20, and a predetermined charge is accumulated in the capacitor 172, for example. The capacitor 172 applies a predetermined voltage in accordance with the accumulated charge to the gate electrode of the load transistor 173.

The comparison circuit unit 16 includes one comparison circuit 32 for one vertical signal line 24. The comparison circuit 32 compares a detection signal VSL of the pixel PX inputted via the vertical signal line 24 and a reference signal RAMP supplied from the reference signal generation unit 18, and outputs a comparison result signal COM_Out. Further, the comparison circuit unit 16 performs the auto zero operation by using a zero reset signal in the auto zero period.

The comparison circuit 32 includes capacitors (capacitance elements) 181 and 182, switches 183 and 184, a comparator 185, and a sense amplifier 186.

The capacitors 181 and 182 and the switches 183 and 184 are set to ON when performing the auto zero operation in which two input terminals of the comparator 185 are set to the same voltage. More specifically, during the auto zero operation, the switches 183 and 184 are set to ON, and the capacitors 181 and 182 are charged so that the voltages given to a first input terminal connected to the vertical signal line 24 and a second input terminal connected to the reference signal generation unit 18 are equal. The switches 183 and 184 are controlled by, for example, the system control unit 20.

The comparator 185 compares an input signal $VSL_{IN}$ inputted to the first input terminal and a reference signal RAMP inputted to the second input terminal, and outputs a comparison result signal COM_Out to the counter 33 via the sense amplifier 186. To the first input terminal, a base signal $BSL_1$ generated by the base signal generation circuit 141 is inputted as an input signal $VSL_{IN}$ during an auto zero operation, and a detection signal VSL is inputted from the pixel PX during a counting operation. During the counting operation, in a case where the detection signal VSL of the pixel PX inputted as an input signal $VSL_{IN}$ is smaller than the reference signal RAMP, the comparator 185 outputs a comparison result signal COM_Out of Hi (High); in a case where the detection signal VSL is larger than the reference signal RAMP, the comparator 185 outputs a comparison result signal COM_Out of Lo (Low).

The sense amplifier 186 amplifies a comparison result signal COM_Out outputted by the comparator 185, and outputs the amplified signal to the counter unit 17.

The counter unit 17 includes one counter 33 for one vertical signal line 24.

The counter 33 counts up an internal counter only while a comparison result signal COM_Out of Hi is being supplied, on the basis of a clock signal AD_CLK supplied from the system control unit 20. The counting result is a detection signal VSL after A/D conversion.

<Detection Signal Reading Operation>

Figure 7:
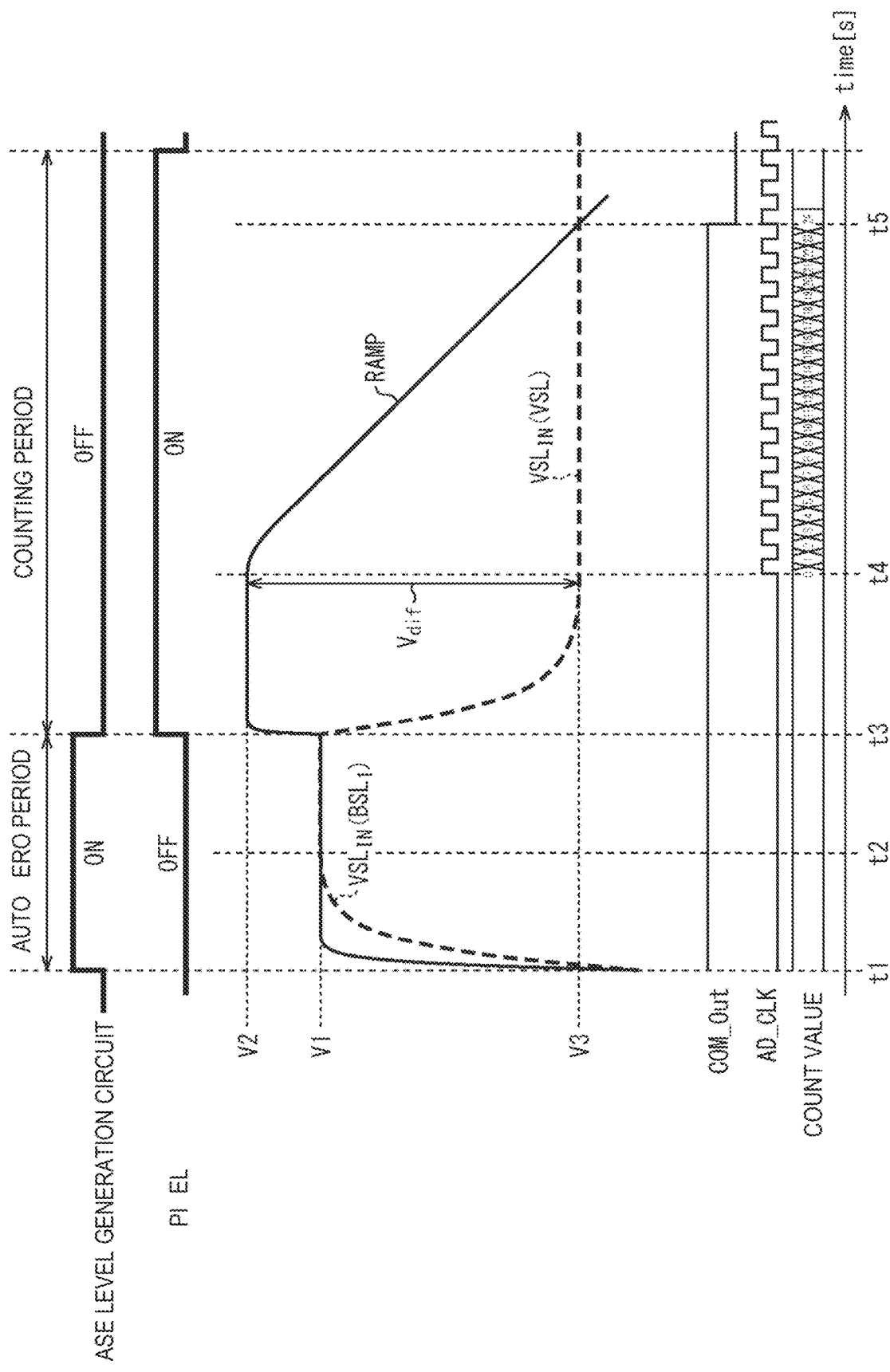
FIG. 7 is a diagram describing an operation of reading a detection signal of a pixel in the first embodiment.

The operation of reading a detection signal VSL of the pixel PX of the light receiving device 1 according to the first embodiment is described with reference to FIG. 7.

Charges generated by reflected light being photoelectrically converted in each pixel PX are distributed and accumulated in the N+ semiconductor regions 71-1 and 71-2, which are charge detection units, by a voltage GDA applied to the first tap TA and a voltage GDB applied to the second tap TB. The charges distributed and accumulated in the N+ semiconductor regions 71-1 and 71-2 are transferred to the FD 102A and the FD 102B, and are then read as detection signals VSL of the pixel PX by the following reading operation.

First, in an auto zero period from time t1 to time t3, an auto zero operation that cancels the threshold variation between comparators 185 is performed.

In the auto zero operation, all the base signal generation circuits 141 of the base signal generation unit 14 are set to ON by the control of the system control unit 20, and a base signal $BSL_1$ generated by each base signal generation circuit 141 is supplied to the comparison circuit 32 of the comparison circuit unit 16 connected via the vertical signal line 24. In each comparison circuit 32 of the comparison circuit unit 16, the switches 183 and 184 have been set to ON.

By the auto zero operation, an input signal $VSL_{IN}$ and a reference signal RAMP are inputted to the comparator 185 of the comparison circuit 32 in a settling period from time t1 to time t2. Here, the input signal $VSL_{IN}$ is the base signal $BSL_1$ outputted from the base signal generation circuit 141, and the input signal $VSL_{IN}$ and the reference signal RAMP transition so as to become a predetermined base voltage V1, and coincide before time t3. Thereby, the threshold variation between comparators 185 is canceled.

At time t3, at which the auto zero period ends, each base signal generation circuit 141 of the base signal generation unit 14 is set to OFF, and also the switches 183 and 184 of each comparison circuit 32 of the comparison circuit unit 16 are set to OFF.

The next period from time t3 to time t5 is a counting period in which an analog detection signal VSL of the pixel PX to be read is read and counted, and is thereby converted to a digital value.

At time t3, the selection transistors 107A and 107B of the pixel PX to be read are set to ON, and the voltage of the reference signal RAMP outputted from the reference signal generation unit 18 is set to a voltage V2 that is offset by a predetermined electric potential from the base voltage V1 in the auto zero operation.

Thereby, in a settling period from time t3 to time t4, the input signal $VSL_{IN}$ inputted to the first input terminal of the comparator 185 of the comparison circuit 32 transitions to a voltage V3 of the detection signal VSL of the pixel PX, and the reference signal RAMP inputted to the second input terminal transitions to the voltage V2.

In the next period from time t4 to time t5, a clock signal AD_CLK is supplied from the system control unit 20 to the counter 33, and the counter 33 executes counting on the basis of the clock signal AD_CLK during the period when a comparison result signal COM_Out of Hi is being supplied from the comparator 185.

If, at time t5, the voltages of the input signal $VSL_{IN}$ and the reference signal RAMP coincide and the comparison result signal COM_Out transitions to Lo, the counter 33 stops counting. The counting result is an A/D converted value of the detection signal VSL of the pixel PX to be read. After that, the A/D converted value of the detection signal VSL is outputted to the signal processing unit 21 at a predetermined timing by the control of the horizontal scanning circuit 19.

As above, in the first embodiment of the light receiving device 1, the base signal generation circuit 141 that outputs a base signal $BSL_1$ as a zero reset signal in the event of performing the auto zero operation is provided between the pixel PX that outputs a detection signal VSL and the comparator 185 that compares the detection signal VSL and a reference signal RAMP.

Before the execution of the counting operation in which an analog detection signal VSL of the pixel PX to be read is converted to a digital value, the base signal generation circuit 141 generates a base signal $BSL_1$, and outputs the base signal $BSL_1$ to the comparator 185 of the comparison circuit 32. The comparator 185 of the comparison circuit 32 executes the auto zero operation by using the base signal $BSL_1$ as an input signal $VSL_{IN}$. Thereby, the threshold variation between comparators 185 can be canceled, and the comparators 185 can output detection signals VSL in which element variation is eliminated.

<2. Second Embodiment of Light Receiving Device>

Next, a second embodiment of a light receiving device is described.

In the first embodiment described above, the base voltage V1 of the base signal $BSL_1$ supplied to the comparison circuit 32 as a zero reset signal during the auto zero operation is an arbitrary voltage that is set regardless of the detection signal VSL outputted by the pixel PX. However, depending on the setting of the base voltage V1, the difference $V_{dif}$ between the voltage V2 of the reference signal RAMP and the voltage V3 of the detection signal VSL of the pixel PX at the time of the start of the counting period is larger than necessary, and the counting period may be longer than necessary.

Thus, in the light receiving device 1 of the second embodiment, a configuration in which the voltage supplied to the comparison circuit 32 as a zero reset signal during the auto zero operation is set to a value related to the detection signal VSL outputted by the pixel PX and thereby the counting period is prevented from being longer than necessary is described.

<Configuration Example of Light Receiving Device>

Figure 8:
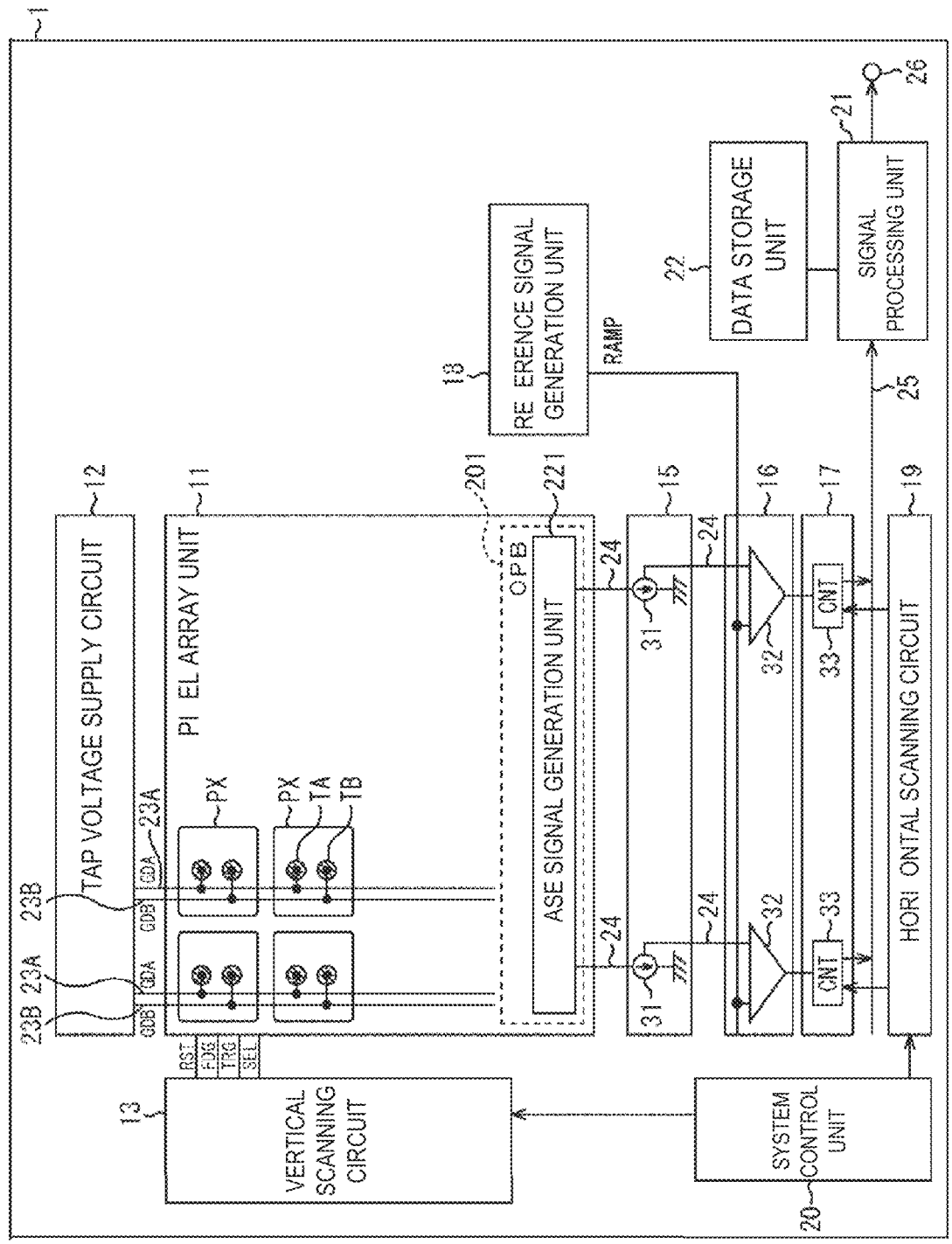
FIG. 8 is a block diagram showing a configuration example of a second embodiment of a light receiving device to which an embodiment of the present technology is applied.

FIG. 8 is a block diagram showing a configuration example of the second embodiment of the light receiving device to which an embodiment of the present technology is applied.

In FIG. 8, portions corresponding to FIG. 1 in the first embodiment are marked with the same reference numerals, and a description of the portions is omitted as appropriate.

In the first embodiment shown in FIG. 1, the base signal generation unit 14 is provided outside the pixel array unit 11; however, in the second embodiment of FIG. 8, a base signal generation unit 221 is provided in an OPB region 201 in the pixel array unit 11.

That is, the second embodiment differs from the first embodiment in that, in place of the base signal generation unit 14 of the first embodiment, the base signal generation unit 221 is provided in the OPB region 201 in the pixel array unit 11, and is common to the first embodiment in the other respects.

The OPB region 201 is a region where light shielded pixels PXG each of which has the same pixel circuit configuration as the pixel PX but in each of which the photoelectric conversion region (the semiconductor substrate 61) is shielded from light so that reflected light is not injected are two-dimensionally arranged. The OPB region 201 has, in the horizontal direction, the same number of columns as the pixels PX (effective pixels) in the effective pixel region of the pixel array unit 11, for example, and has two rows in the vertical direction to correspond to two rows where pixels PX output detection signals VSL0 to VSL3, for example.

<Detailed Configuration Example of Base Level Generation Circuit etc.>

Figure 9:
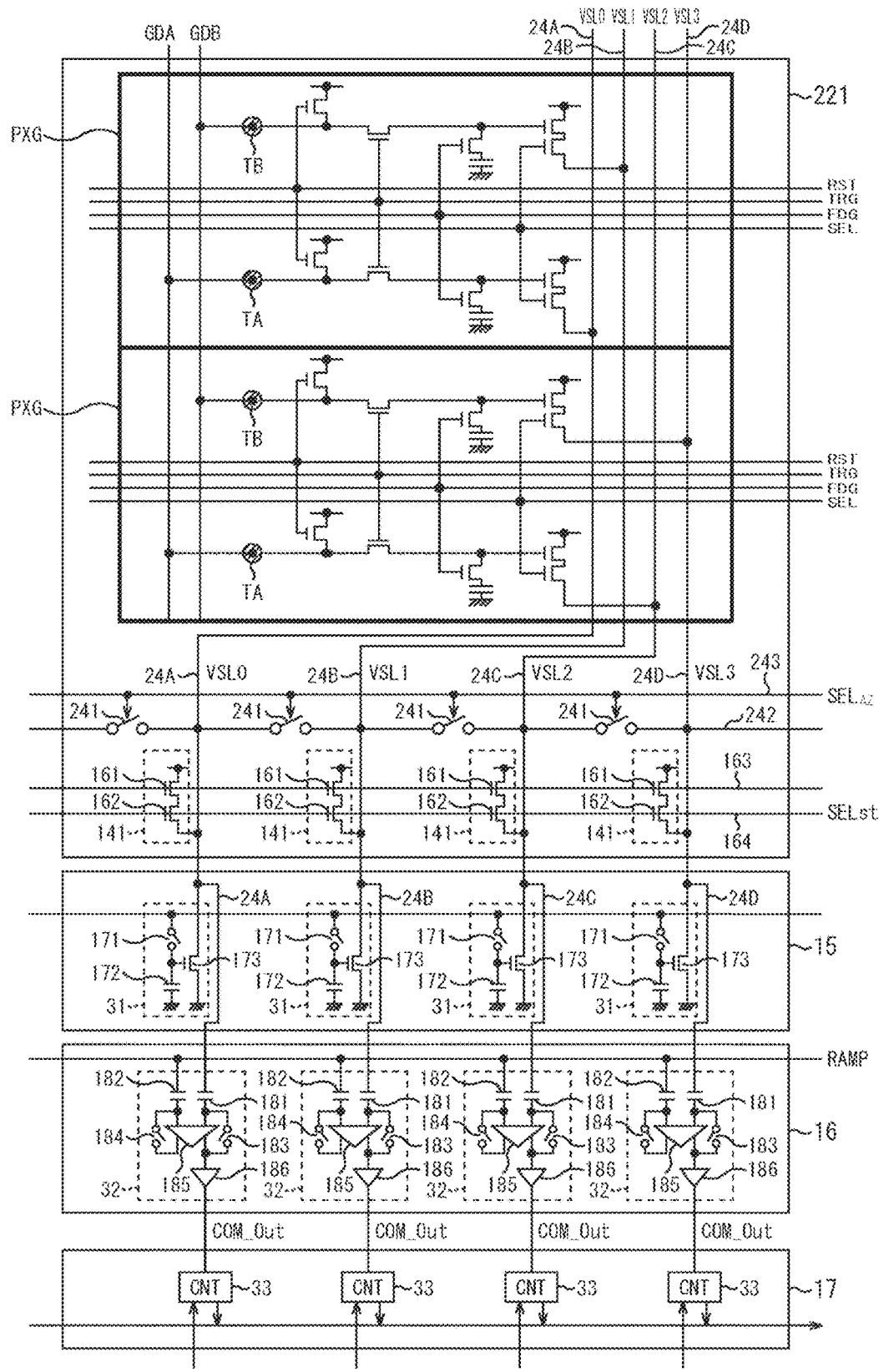
FIG. 9 is a diagram showing a detailed configuration example of a base level generation unit etc. of FIG. 8.

FIG. 9 shows a detailed configuration example of the base signal generation unit 221 of FIG. 8.

Similarly to FIG. 6 shown in the first embodiment, FIG. 9 shows a detailed configuration example of the base signal generation unit 221 corresponding to detection signals VSL0 to VSL3 outputted from two pixels that are adjacent in the vertical direction in the effective pixel region, and the constant current source circuit unit 15, the comparison circuit unit 16, and the counter unit 17 corresponding to the base signal generation unit 221.

Note that a detailed configuration of the constant current source circuit unit 15, the comparison circuit unit 16, and the counter unit 17 is similar to the first embodiment, and therefore a description thereof is omitted.

The base signal generation unit 221 includes, for one pixel column, at least two light shielded pixels PXG, four switches 241, and four base signal generation circuits 141. The two light shielded pixels PXG are arranged in the vertical direction to correspond to two pixels in the vertical direction that output detection signals VSL0 to VSL3 in the effective pixel region.

Each of the two light shielded pixels PXG has the same circuit configuration as the pixel PX in the effective pixel region except that the photoelectric conversion region (the semiconductor substrate 61) is shielded from light so that reflected light is not injected. In the auto zero period in which the comparison circuit unit 16 performs the auto zero operation, the light shielded pixel PXG outputs a detection signal $VSL_G$ indicating a black level to the vertical signal line 24.

The base signal generation circuit 141 is provided for one vertical signal line 24 on a one-to-one basis like in the first embodiment. The switches 241 are arranged for all the vertical signal lines 24 arranged in the pixel array unit 11, between vertical signal lines 24 adjacent in the horizontal direction on a one-to-one basis. The plurality of switches 241 in the base signal generation unit 221 is mutually connected by one control line 242.

Like in the first embodiment, in the auto zero period in which the comparison circuit unit 16 performs the auto zero operation, the base signal generation circuit 141 generates a base signal $BSL_2$ of a predetermined voltage, and supplies the base signal $BSL_2$ to the comparison circuit 32 of the comparison circuit unit 16.

Thus, in the second embodiment, in the auto zero period in which the comparison circuit unit 16 performs the auto zero operation, a detection signal $VSL_G$ from the light shielded pixel PXG and a base signal $BSL_2$ from the base signal generation circuit 141 are outputted to each vertical signal line 24. The sum signal of the detection signal $VSL_G$ and the base signal $BSL_2$ functions as a zero reset signal in the event in which the comparison circuit unit 16 performs the auto zero operation, and the light shielded pixel PXG and the base signal generation circuit 141 are equivalent to a zero reset signal generation circuit that generates a zero reset signal in the event of performing the auto zero operation.

The switches 241 enter a conduction state in accordance with a selection control signal $SEL_{AZ}$ supplied from the system control unit 20 via a control line 243, and connect together all the vertical signal lines 24 in the pixel array unit 11. During the auto zero period, the system control unit 20 brings all the switches 241 into a conduction state, and causes all the vertical signal lines 24 to be connected together.

By connecting together all the vertical signal lines 24 arranged in the pixel array unit 11 by means of the switches 241, the influence of defective pixels can be suppressed in a case where one or more defective pixels are included among all the light shielded pixels PXG in the OPB region 201.

<Detection Signal Reading Operation>

Figure 10:
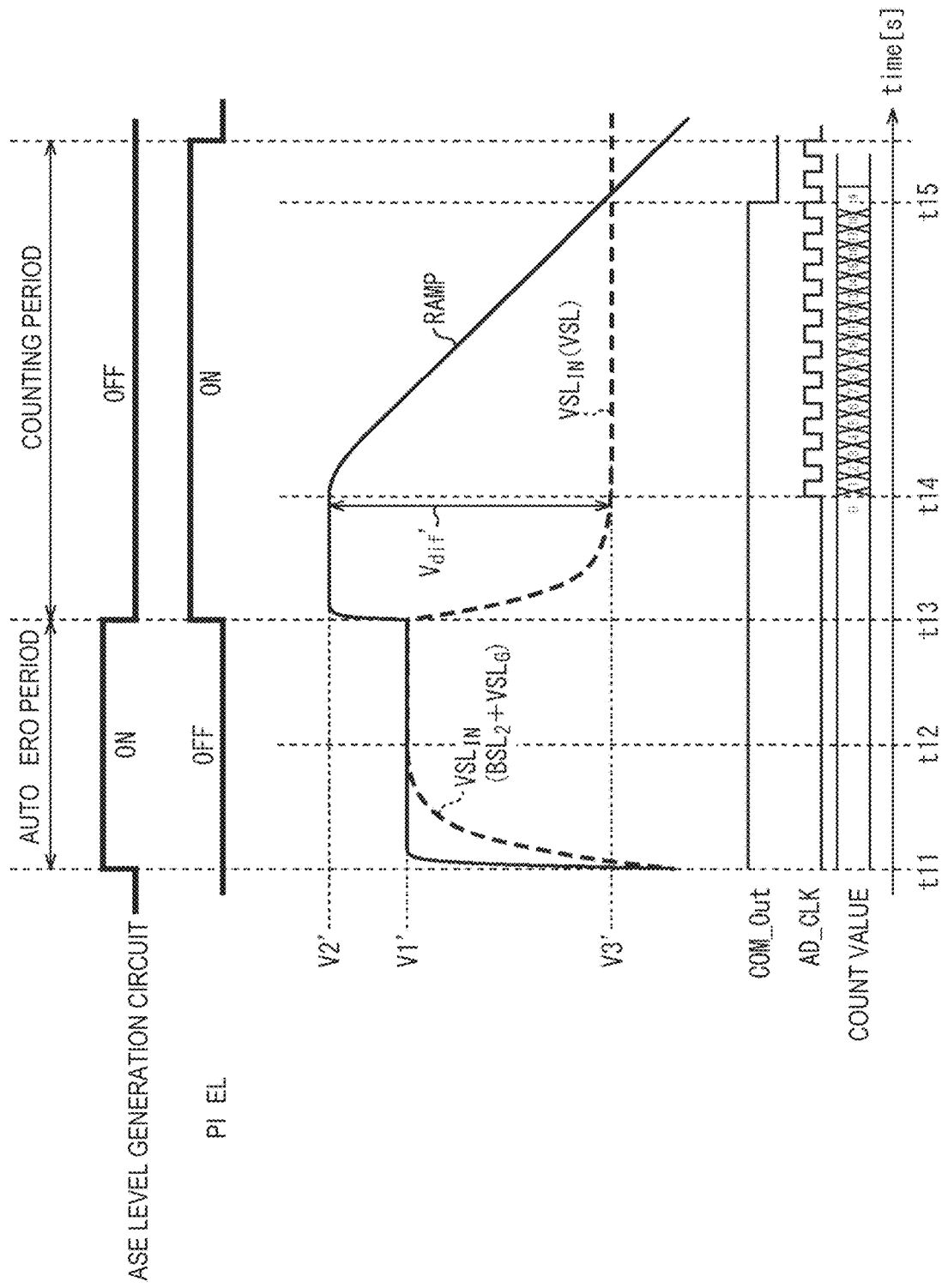
FIG. 10 is a diagram describing an operation of reading a detection signal of a pixel in the second embodiment.

The operation of reading a detection signal VSL of the pixel PX of the light receiving device 1 according to the second embodiment is described with reference to FIG. 10.

Charges generated by reflected light being photoelectrically converted in each pixel PX are distributed and accumulated in the N+ semiconductor regions 71-1 and 71-2, which are charge detection units, by a voltage GDA applied to the first tap TA and a voltage GDB applied to the second tap TB. The charges distributed and accumulated in the N+ semiconductor regions 71-1 and 71-2 are transferred to the FD 102A and the FD 102B, and are then read as detection signals VSL of the pixel PX by the following reading operation.

First, in an auto zero period from time t11 to time t13, an auto zero operation that cancels the threshold variation between comparators 185 is performed.

In the auto zero operation, the selection transistors 107A and 107B of all the light shielded pixels PXG in the OPB region 201 are controlled to ON, and a detection signal $VSL_G$ of the light shielded pixel PXG is read. The detection signal $VSL_G$ of the light shielded pixel PXG is a signal equivalent to a black level. Further, all the base signal generation circuits 141 of the base signal generation unit 221 are set to ON by the control of the system control unit 20, and a predetermined base signal $BSL_2$ is outputted from each base signal generation circuit 141. The base signal $BSL_2$ is a voltage different from the base signal $BSL_1$ in the first embodiment. Further, all the switches 241 in the base signal generation unit 221 are set to ON in accordance with a selection control signal $SEL_{AZ}$ of Hi.

By the auto zero operation, an input signal $VSL_{IN}$ and a reference signal RAMP are inputted to the comparator 185 of the comparison circuit 32 in a settling period from time t11 to time t12. Here, the input signal $VSL_{IN}$ is a signal in which the detection signal $VSL_G$ of the light shielded pixel PXG and the base signal $BSL_2$ outputted from the base signal generation circuit 141 are added up. The input signal $VSL_{IN}$ and the reference signal RAMP transition so as to become a predetermined base voltage V1', and coincide before time t13. Thereby, the threshold variation between comparators 185 is canceled.

At time t13, at which the auto zero period ends, the selection transistors 107A and 107B of all the light shielded pixels PXG in the OPB region 201, all the base signal generation circuits 141 and the switches 241 of the base signal generation unit 221, and the switches 183 and 184 of all the comparison circuits 32 of the comparison circuit unit 16 are set to OFF.

The next period from time t13 to time t15 is a counting period in which an analog detection signal VSL of the pixel PX to be read is read and counted, and is thereby converted to a digital value.

At time t13, the selection transistors 107A and 107B of the pixel PX to be read are set to ON, and the voltage of the reference signal RAMP outputted from the reference signal generation unit 18 is set to a voltage V2' that is offset by a predetermined electric potential from the base voltage V1' in the auto zero operation.

Thereby, in a settling period from time t13 to time t14, the input signal $VSL_{IN}$ inputted to the first input terminal of the comparator 185 of the comparison circuit 32 transitions to a voltage V3' of the detection signal VSL of the pixel PX, and the reference signal RAMP inputted to the second input terminal transitions to the voltage V2'.

In the next period from time t14 to time t15, a clock signal AD_CLK is supplied from the system control unit 20 to the counter 33, and the counter 33 executes counting on the basis of the clock signal AD_CLK during the period when a comparison result signal COM_Out of Hi is being supplied from the comparator 185.

If, at time t15, the voltages of the input signal $VSL_{IN}$ and the reference signal RAMP coincide and the comparison result signal COM_Out transitions to Lo, the counter 33 stops counting. The counting result is an A/D converted value of the detection signal VSL of the pixel PX to be read. After that, the A/D converted value of the detection signal VSL is outputted to the signal processing unit 21 at a predetermined timing by the control of the horizontal scanning circuit 19.

As above, in the second embodiment of the light receiving device 1, the base signal generation unit 221 is provided in the OPB region 201. The base signal generation unit 221 includes a plurality of light shielded pixels PXG, and supplies a signal in which a detection signal $VSL_G$ indicating a black level outputted by each of the plurality of light shielded pixels PXG and a base signal $BSL_2$ outputted by the base signal generation circuit 141 are summed up to the comparator 185 of the comparison circuit 32, as a zero reset signal in the event of performing the auto zero operation.

The comparator 185 of the comparison circuit 32 executes the auto zero operation by using the sum signal of the detection signal $VSL_G$ and the base signal $BSL_2$ as a zero reset signal. Thereby, the threshold variation between comparators 185 can be canceled, and the comparators 185 can output detection signals VSL in which element variation is eliminated.

Further, the zero reset signal supplied as an input signal $VSL_{IN}$ to the comparator 185 during the auto zero operation is a signal in which a detection signal $VSL_G$ equivalent to a black level outputted by the light shielded pixel PXG is taken as a base; hence, the difference $V_{dif}'$ between the voltage V2' of the reference signal RAMP and the voltage V3' of the detection signal VSL of the pixel PX at the time of the start of the counting period can be set smaller than the difference $V_{dif}$ in the first embodiment ($V_{dif}'<V_{dif}$), and the counting period can be prevented from being longer than necessary. In other words, the maximum count value in the counting period can be set appropriately. The threshold variation can be suppressed to only the in-plane variation of a chip for forming the light receiving device 1.

Further, during the auto zero period, all the switches 241 in the base signal generation unit 221 are set to ON, and all the vertical signal lines 24 are connected together; thereby, even in a case where defective pixels are included among all the light shielded pixels PXG in the OPB region 201, detection signals $VSL_G$ in which the influence of defective pixels is suppressed can be outputted to the comparison circuits 32.

Note that, in the second embodiment described above, a configuration including the light shielded pixel PXG that outputs a detection signal $VSL_G$ and the base signal generation circuit 141 that outputs a base signal $BSL_2$ is described as a configuration of the base signal generation unit 221 corresponding to one comparison circuit 32; however, the base signal generation circuit 141 may be omitted. In this case, in the auto zero operation, only a detection signal $VSL_G$ from the light shielded pixel PXG is supplied as an input signal $VSL_{IN}$ to the first input terminal of the comparator 185; thus, the light shielded pixel PXG is equivalent to a zero reset signal generation circuit that generates a zero reset signal in the event of performing the auto zero operation.

Further, in the second embodiment described above, it is mentioned that the light shielded pixel PXG in the OPB region 201 has, in the horizontal direction, the same number of columns as the pixels PX (effective pixels) of the pixel array unit 11, and has two rows in the vertical direction to correspond to two rows in the vertical direction in the effective pixel region. However, in the vertical direction, one row is possible, or three or more rows are possible. By arranging a larger number of light shielded pixels PXG in the OPB region 201, the influence of defective pixels in a case where defective pixels are included among the light shielded pixels PXG in the OPB region 201 can be suppressed more in the auto zero operation.

In both the first embodiment and the second embodiment of the light receiving device 1, a zero reset signal generation circuit including at least one of the base signal generation circuit 141 or the light shielded pixel PXG generates and supplies a zero reset signal in the event in which the comparator 185 of the comparison circuit 32 performs the auto zero operation, and thereby detection signals VSL in which element variation between comparators 185 is eliminated can be outputted. Thus, distance information with suppressed element variation can be generated.

<3. Modification Examples>

<Number of Vertical Signal Lines>

In each of the embodiments described above, the light receiving device 1 has a configuration in which four vertical signal lines 24A to 24D are arranged for one pixel column of the pixel array unit 11 and four detection signals VSL of a first pixel PX and a second pixel PX of two rows adjacent in the vertical direction are simultaneously outputted. That is, the light receiving device 1 has a configuration in which a detection signal VSL0 of the first tap TA and a detection signal VSL1 of the second tap TB of the first pixel PX and a detection signal VSL2 of the first tap TA and a detection signal VSL3 of the second tap TB of the second pixel PX are simultaneously outputted.

Figure 11:
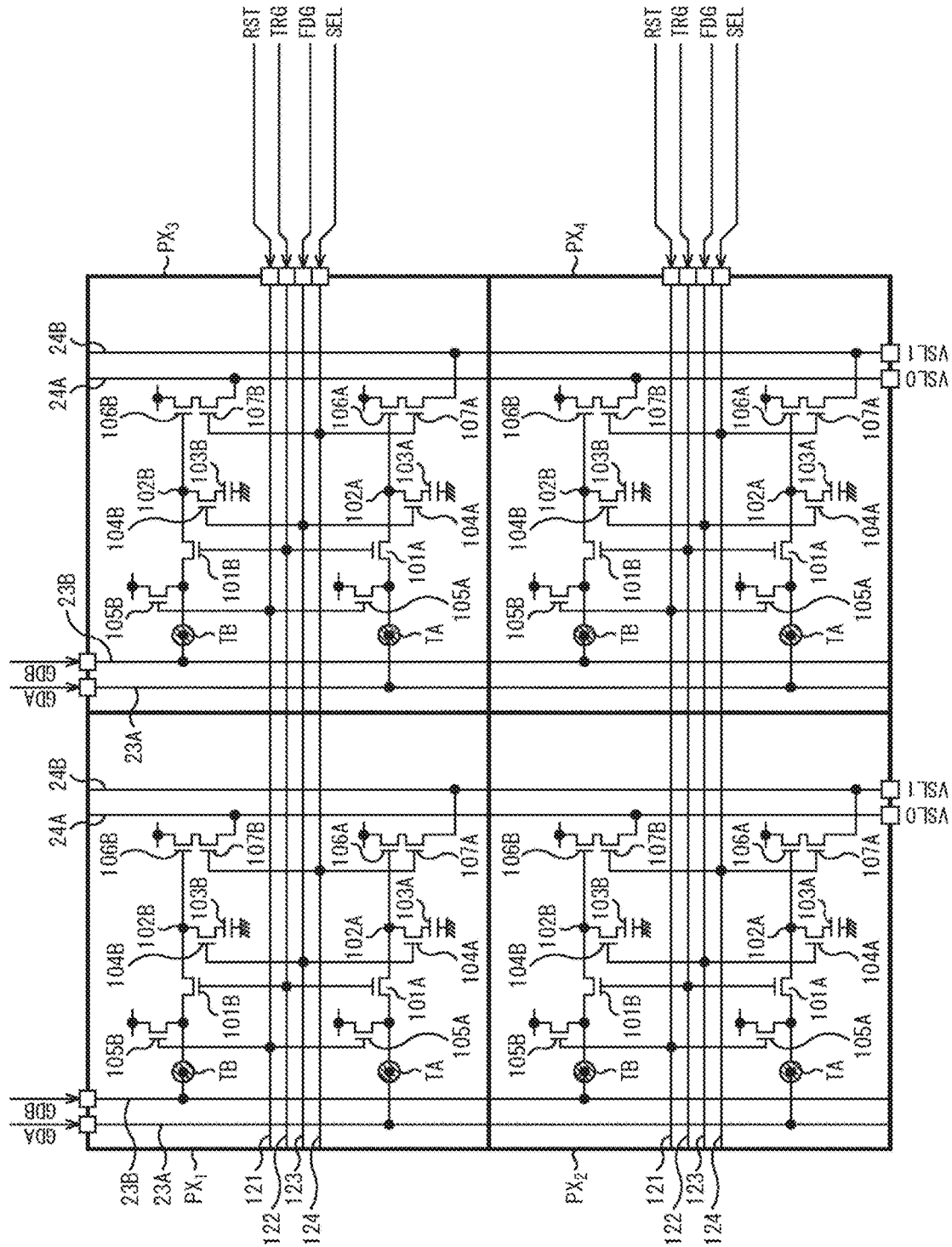
FIG. 11 is a diagram showing another configuration example of vertical signal lines.

However, for example as shown in FIG. 11, a configuration in which two vertical signal lines 24A and 24B are arranged for one pixel column of the pixel array unit 11 may be employed, and a configuration in which detection signals VSL0 of the first taps TA and detection signals VSL1 of the second taps TB of pixels PX are line-sequentially outputted in units of one row may be employed. In this case, as shown in FIG. 11, a reset driving signal RST, an FD driving signal FDG, a transfer driving signal TRG, and a selection signal SEL are supplied from the vertical scanning circuit 13 on a row basis.

In a configuration example like that shown in FIG. 5 in which four vertical signal lines 24A to 24D are arranged for one pixel column, the reading of detection signals VSL of the entire pixel array unit 11 can be executed at high speed, but the number of vertical signal lines 24 is large.

On the other hand, in a configuration example in which two vertical signal lines 24A and 24B are arranged for a pixel column like in FIG. 11, although the reading of detection signals VSL of the entire pixel array unit 11 is slow, the number of vertical signal lines 24 can be reduced.

<Pixel of Gate Electrode Structure>

In each of the embodiments described above, the pixel PX of the light receiving device 1 has a CAPD structure in which a predetermined voltage GDA or GDB is directly applied to each of the P+ semiconductor regions 73-1 and 73-2 of the semiconductor substrate 61 and a signal charge (electrons) generated by photoelectric conversion is transferred to the N+ semiconductor region 71-1 or 71-2 as a charge detection unit.

However, an embodiment of the present technology can be applied to not only a pixel PX of the CAPD structure but also a pixel PX of a gate electrode structure in which a signal charge (electrons) generated by a photodiode is distributed to two FDs as charge accumulation units by two transfer transistors.

Figure 12:
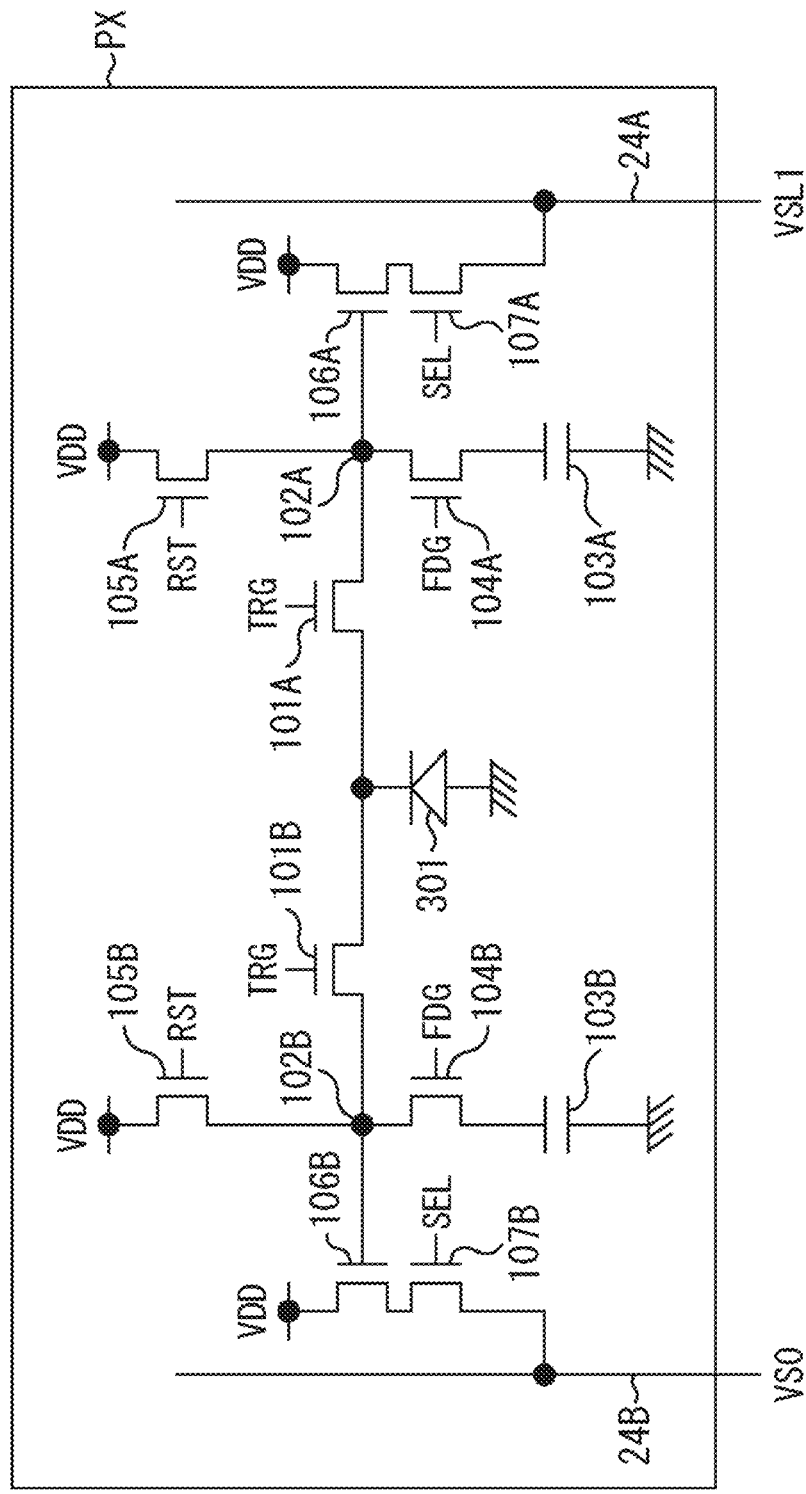
FIG. 12 is a diagram showing another configuration example of a pixel.

FIG. 12 shows an equivalent circuit of the pixel PX in a case where the pixel PX has a gate electrode structure.

The pixel PX may have a similar configuration to the pixel PX of the CAPD structure shown in FIG. 4 except that a photodiode 301 is formed in the semiconductor substrate 61. In the pixel PX of the gate electrode structure, the transfer transistors 101A and 101B that transfer a charge generated by the photodiode 301 to the FDs 102A and 102B are equivalent to the first tap TA and the second tap TB.

<4. Configuration Example of Ranging Module>

Figure 13:
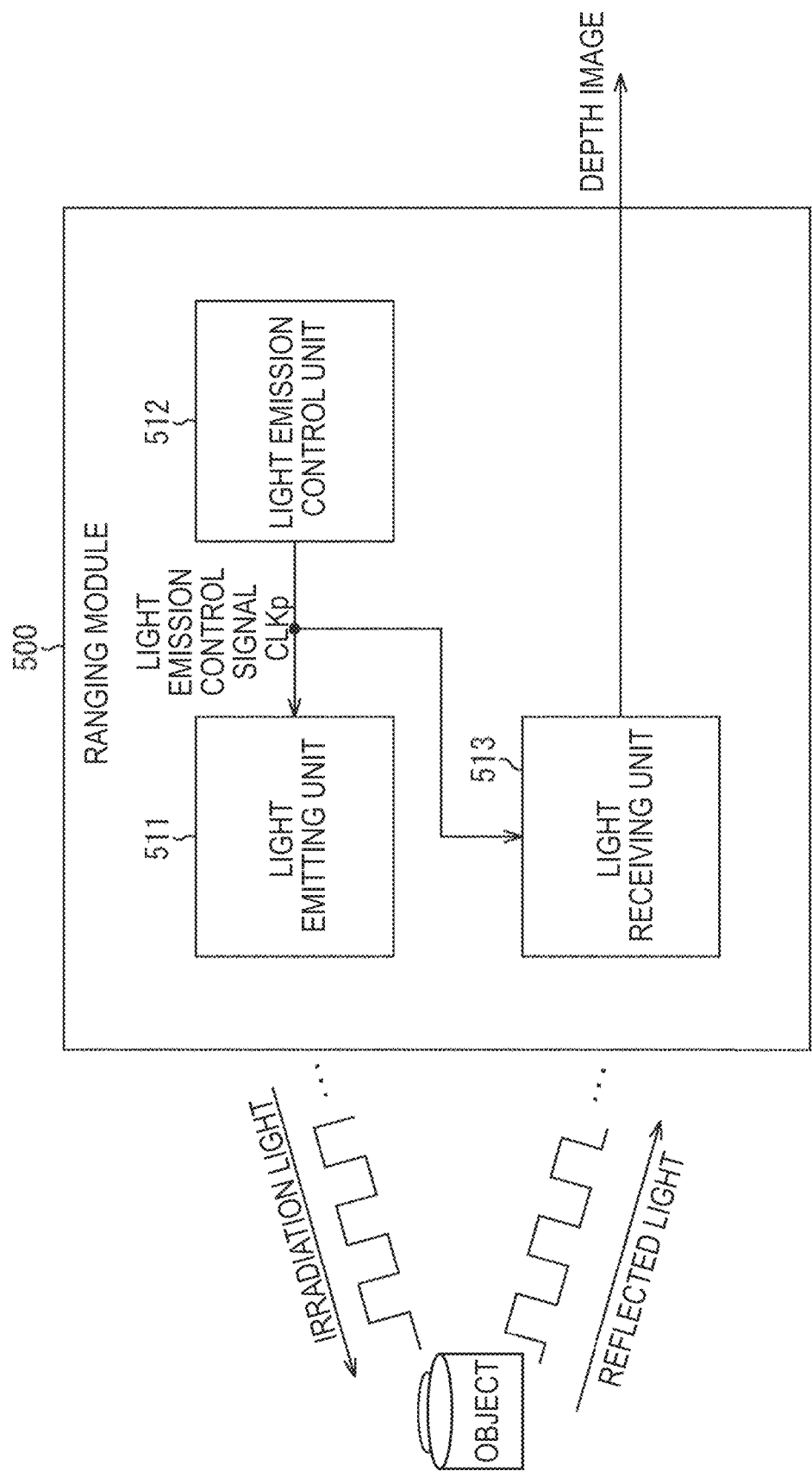
FIG. 13 is a block diagram illustrating a configuration example of a ranging module.

FIG. 13 is a block diagram illustrating the configuration example of the ranging module that outputs distance measurement information using the light receiving device 1 described above.

The ranging module 500 includes a light emitting unit 511, a light emission control unit 512, and a light receiving unit 513.

The light emitting unit 511 has a light source that emits light having a predetermined wavelength, and irradiates the object with irradiation light of which brightness periodically changes. For example, the light emitting unit 511 has a light emitting diode that emits infrared light having a wavelength in a range of 780 nm to 1000 nm as a light source, and generates the irradiation light in synchronization with a light emission control signal CLKp of a rectangular wave supplied from the light emission control unit 512.

Note that, the light emission control signal CLKp is not limited to the rectangular wave as long as the control signal CLKp is a periodic signal. For example, the light emission control signal CLKp may be a sine wave.

The light emission control unit 512 supplies the light emission control signal CLKp to the light emitting unit 511 and the light receiving unit 513 and controls an irradiation timing of the irradiation light. A frequency of the light emission control signal CLKp is, for example, 20 megahertz (MHz). Note that, the frequency of the light emission control signal CLKp is not limited to 20 megahertz (MHz), and may be 5 megahertz (MHz) or the like.

The light receiving unit 513 receives reflected light reflected from the object, calculates the distance information for each pixel according to a light reception result, generates a depth image in which a depth value corresponding to the distance to the object (subject) is stored as a pixel value, and outputs the depth image.

The light receiving device 1 according to the first embodiment or the second embodiment is used for the light receiving unit 513, and for example, the light receiving device 1 serving as the light receiving unit 513 calculates the distance information for each pixel from a signal intensity detected by each charge detection unit (N+ semiconductor region 71) of each of the signal extraction units 65-1 and 65-2 of each pixel PX of the pixel array unit 11, on the basis of the light emission control signal CLKp.

As described above, the light receiving device 1 according to the first embodiment or the second embodiment is able to be incorporated as the light receiving unit 513 of the ranging module 500 that obtains and outputs the information associated with the distance to the subject by the indirect ToF method. Thus, it is possible to improve a distance measurement characteristic of the ranging module 500.

<5. Configuration Example of Electronic Apparatus>

Note that the light receiving device 1 can be used for a ranging module as described above, and furthermore can be used for, for example, various electronic apparatuses such as imaging devices such as digital still cameras and digital video cameras including a distance measurement function, and smartphones including a distance measurement function.

Figure 14:
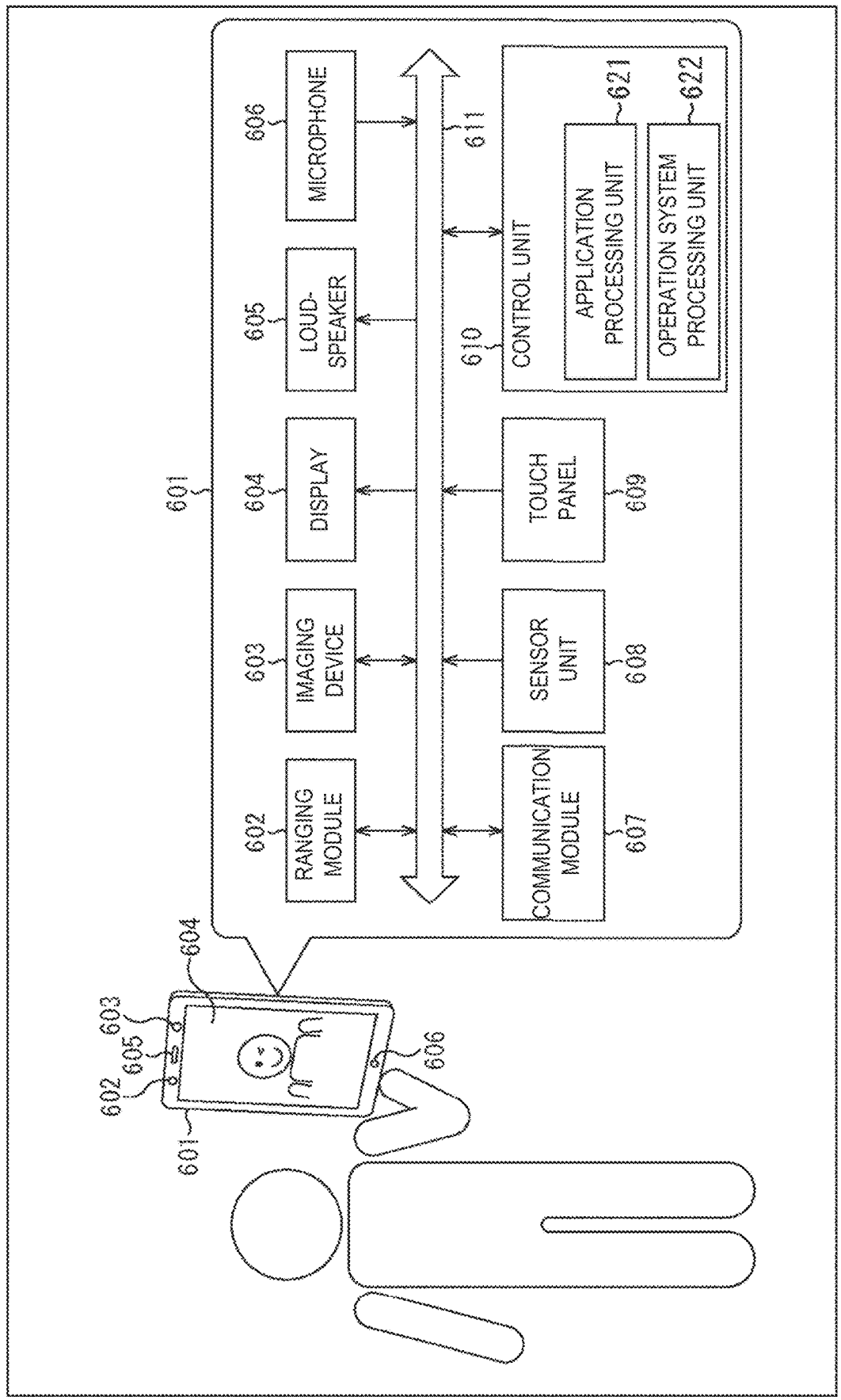
FIG. 14 is a block diagram showing a configuration example of a smartphone as an electronic apparatus to which an embodiment of the present technology is applied.

FIG. 14 is a block diagram showing a configuration example of a smartphone as an electronic apparatus to which an embodiment of the present technology is applied.

In a smartphone 601, as shown in FIG. 14, a ranging module 602, an imaging device 603, a display 604, a loudspeaker 605, a microphone 606, a communication module 607, a sensor unit 608, a touch panel 609, and a control unit 610 are connected together via a bus 611. Further, in the control unit 610, a CPU executes programs; thus, the control unit 610 has a function as an application processing unit 621 and an operation system processing unit 622.

The ranging module 500 of FIG. 13 is used as the ranging module 602. For example, the ranging module 602 is placed on the front surface of the smartphone 601, and the measurement of the distance to a user of the smartphone 601 as an object is performed; thereby, the depth value of the surface shape of the face, a hand, a finger, or the like of the user can be outputted as a distance measurement result.

The imaging device 603 is placed on the front surface of the smartphone 601; and images the user of the smartphone 601 as a subject, and thereby acquires an image in which the user is photographed. Note that, although not illustrated, also a configuration in which an imaging device 603 is additionally placed on the back surface of the smartphone 601 is possible.

The display 604 displays an operation screen for performing processing by the application processing unit 621 and the operation system processing unit 622, an image captured by the imaging device 603, etc. When, for example, performing a telephone call by means of the smartphone 601, the loudspeaker 605 and the microphone 606 output the other side's voice and collect the user's voice.

The communication module 607 performs network communication via a communication net such as the Internet, a public telephone network, a wide area communication net for wireless mobile objects such as what is called a 4G line or a 5G line, or a wide area network (WAN) or a local area network (LAN), short distance wireless communication such as Bluetooth (registered trademark) or near field communication (NFC), or the like. The sensor unit 608 senses speed, acceleration, proximity, etc., and the touch panel 609 acquires a touch operation by the user on an operation screen displayed on the display 604.

The application processing unit 621 performs processing for providing various services by means of the smartphone 601. For example, the application processing unit 621 can perform processing in which a computer graphics-based face in which an expression of the user is virtually reproduced is created on the basis of depth values supplied from the ranging module 602 and is displayed on the display 604. Further, the application processing unit 621 can perform processing in which, for example, three-dimensional shape data of an arbitrary solid object are created on the basis of depth values supplied from the ranging module 602.

The operation system processing unit 622 performs processing for implementing the basic function and operation of the smartphone 601. For example, the operation system processing unit 622 can perform processing in which the user's face is authenticated on the basis of depth values supplied from the ranging module 602 and a lock of the smartphone 601 is released. Further, the operation system processing unit 622 can perform processing in which, for example, the processing of recognizing a gesture of the user is performed on the basis of depth values supplied from the ranging module 602 and various operations in accordance with the gesture are inputted.

In such a smartphone 601, for example, the processing of measuring and displaying the distance to a predetermined object, creating and displaying three-dimensional shape data of a predetermined object, etc. can be performed by using the ranging module 500 described above as the ranging module 602.

<6. Example of Application to Mobile Object>

The technology (present technology) according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

Figure 15:
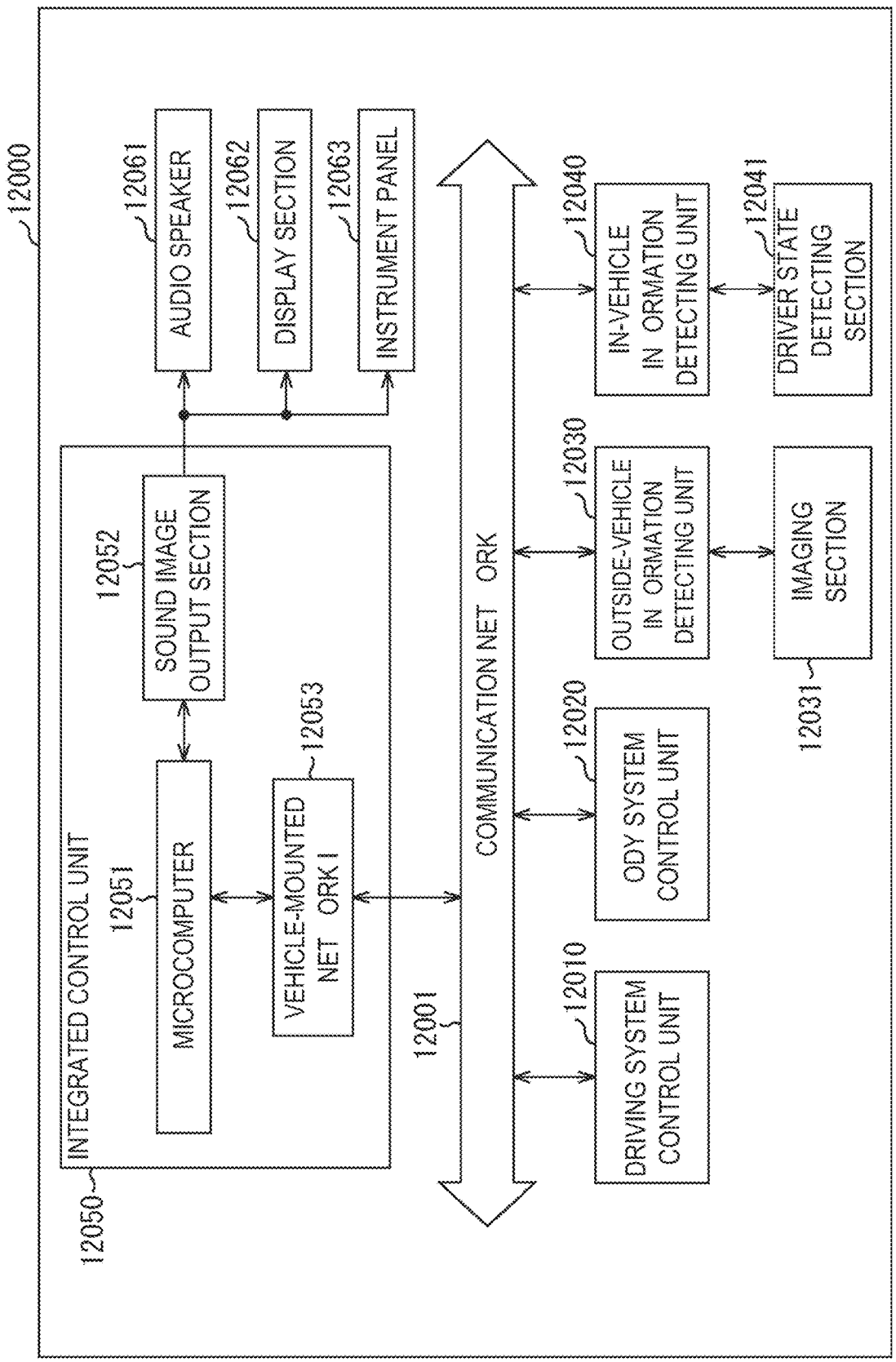
FIG. 15 is a block diagram depicting an example of schematic configuration of a vehicle control system.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 15, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

Figure 16:
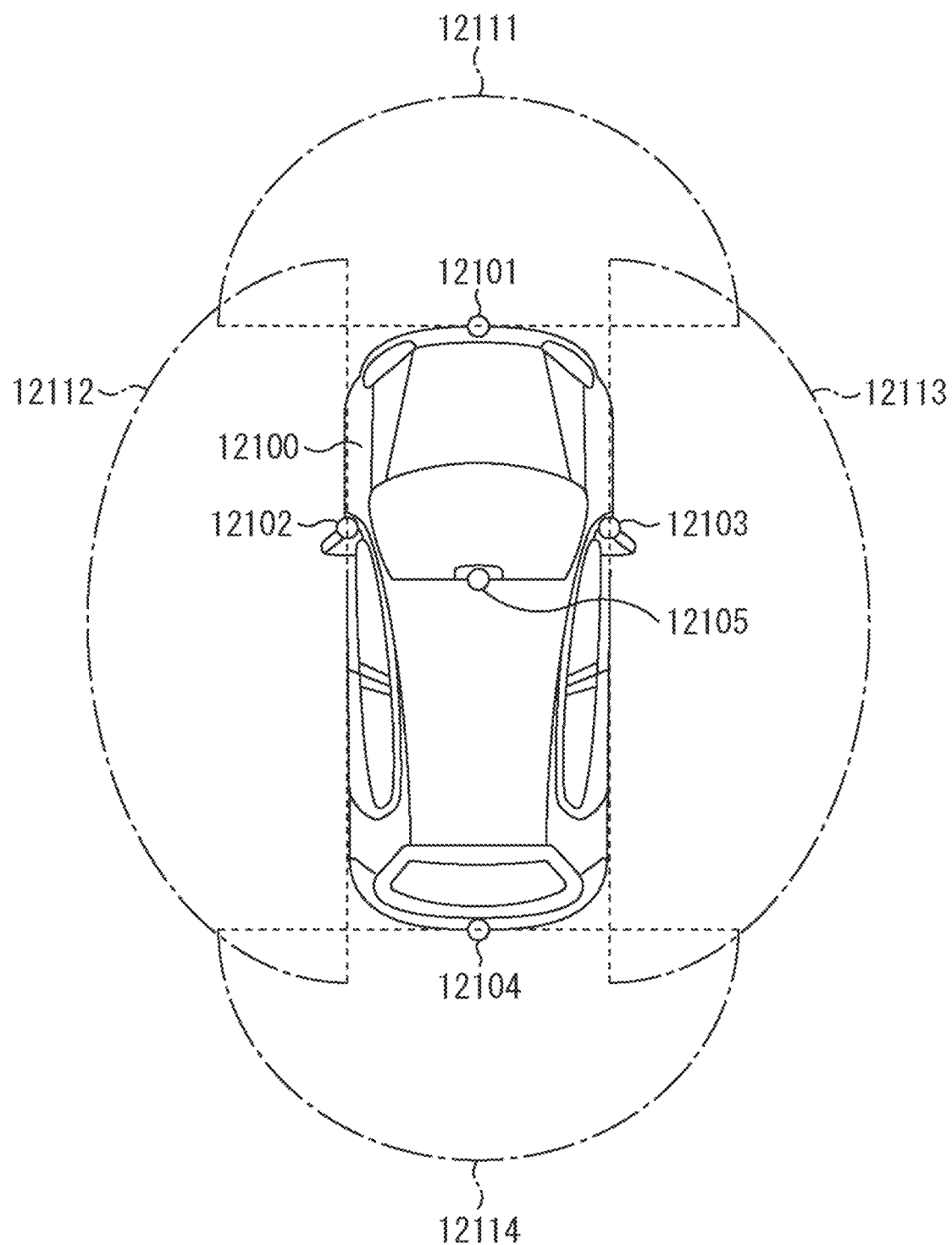
FIG. 16 is a diagram of assistance in explaining an example of installation positions of an outside-vehicle information detecting section and an imaging section.

FIG. 16 is a diagram depicting an example of the installation position of the imaging section 12031.

In FIG. 16, the vehicle 12100 as the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front of the vehicle obtained by the imaging sections 12102 and 12105 is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Hereinabove, an example of a vehicle control system to which the technology according to the present disclosure can be applied is described. The technology according to the present disclosure can be applied to the outside-vehicle information detecting unit 12030 or the imaging section 12031 of the configuration described above. Specifically, the light receiving device 1 or the ranging module 500 can be used for a distance detection processing block of the outside-vehicle information detecting unit 12030 or the imaging section 12031. By applying the technology according to the present disclosure to the outside-vehicle information detecting unit 12030 or the imaging section 12031, the distance from an object such as a person, a car, an obstacle, a mark, or a character on the road surface can be measured with high accuracy; thus, the fatigue of the driver can be reduced by using the obtained distance information, and the degree of safety of the driver or the vehicle can be enhanced.

The embodiment of the present technology is not limited to the embodiments described above, and various alternations are possible without departing from the gist of the present technology.

Further, although an example in which electrons are used as signal carriers is described in the light receiving device 1 described above, holes generated by photoelectric conversion may be used as signal carriers. In such a case, a charge detection unit for detecting signal carriers may include a P+ semiconductor region and a voltage application unit for generating an electric field in a substrate may include an N+ semiconductor region so that holes as signal carriers are detected in the charge detection unit provided in the signal extraction unit.

For example, in the light receiving device 1 described above, a form in which all or some of the embodiments are combined may be employed.

Note that the effects described in the present specification are only examples and are not limitative ones, and there may be effects other than the effects described in the present specification.

Additionally, the present technology may also be configured as below.

(1)

A light receiving device including: a pixel including a first tap configured to detect a charge photoelectrically converted by a photoelectric conversion unit, and a second tap configured to detect a charge photoelectrically converted by the photoelectric conversion unit;

a first comparison circuit configured to compare a first detection signal detected by the first tap and a reference signal;

a second comparison circuit configured to compare a second detection signal detected by the second tap and the reference signal;

a first zero reset signal generation circuit configured to generate a first zero reset signal that is supplied to the first comparison circuit when the first comparison circuit performs an auto zero operation; and a second zero reset signal generation circuit configured to generate a second zero reset signal that is supplied to the second comparison circuit when the second comparison circuit performs an auto zero operation.

(2)

The light receiving device according to (1), in which each of the first zero reset signal generation circuit and the second zero reset signal generation circuit includes a source follower circuit.

(3)

The light receiving device according to (1), in which each of the first zero reset signal generation circuit and the second zero reset signal generation circuit includes a light shielded pixel configured to be the pixel shielded from light.

(4)

The light receiving device according to (1), in which each of the first zero reset signal generation circuit and the second zero reset signal generation circuit includes a light shielded pixel configured to be the pixel shielded from light and a source follower circuit.

(5)

The light receiving device according to (3) or (4), further including:

a pixel array unit in which a plurality of the pixels is two-dimensionally arranged;

vertical signal lines each configured to transmit the first detection signal or the second detection signal of the pixel in a vertical direction; and switches each configured to connect arbitrarily defined two vertical signal lines adjacent in a horizontal direction when performing the auto zero operation.

(6)

The light receiving device according to (3) or (4), further including:

a pixel array unit in which pixels are two-dimensionally arranged; and four vertical signal lines configured to transmit the first and second detection signals of two pixels adjacent in a vertical direction in one pixel column, in which the light receiving device includes the first and second detection signals of the pixels of two rows so that both signals are simultaneously read.

(7)

A method for controlling a light receiving device, in which a light receiving device including a pixel including a first tap configured to detect a charge photoelectrically converted by a photoelectric conversion unit, and a second tap configured to detect a charge photoelectrically converted by the photoelectric conversion unit, a first comparison circuit configured to compare a first detection signal detected by the first tap and a reference signal, and a second comparison circuit configured to compare a second detection signal detected by the second tap and the reference signal generates a first zero reset signal and supplies the first zero reset signal to the first comparison circuit when the first comparison circuit performs an auto zero operation, and generates a second zero reset signal and supplies the second zero reset signal to the second comparison circuit when the second comparison circuit performs an auto zero operation.

(8)

An electronic apparatus including:

a light receiving device including a pixel including a first tap configured to detect a charge photoelectrically converted by a photoelectric conversion unit, and a second tap configured to detect a charge photoelectrically converted by the photoelectric conversion unit, a first comparison circuit configured to compare a first detection signal detected by the first tap and a reference signal, a second comparison circuit configured to compare a second detection signal detected by the second tap and the reference signal, a first zero reset signal generation circuit configured to generate a first zero reset signal that is supplied to the first comparison circuit when the first comparison circuit performs an auto zero operation, and a second zero reset signal generation circuit configured to generate a second zero reset signal that is supplied to the second comparison circuit when the second comparison circuit performs an auto zero operation.

(9)

A light receiving device including:

a pixel including a first tap configured to detect a charge photoelectrically converted by a photoelectric conversion unit, and a second tap configured to detect a charge photoelectrically converted by the photoelectric conversion unit;

a first comparison circuit configured to compare a first detection signal detected by the first tap and a reference signal;

a second comparison circuit configured to compare a second detection signal detected by the second tap and the reference signal;

a first vertical signal line configured to transmit the first detection signal of the pixel to the first comparison circuit;

a second vertical signal line configured to transmit the second detection signal of the pixel to the second comparison circuit;
a first zero reset signal generation circuit connected to the first vertical signal line; and
a second zero reset signal generation circuit connected to the second vertical signal line,
in which the first zero reset signal generation circuit and the second zero reset signal generation circuit are connected to the same control line, and
a depth value corresponding to a distance to a subject is calculated in accordance with a difference between the first detection signal and the second detection signal.

What is claimed is:
1. A light receiving device comprising:
a pixel including:
   a first tap configured to detect a charge photoelectrically converted by a photoelectric conversion unit; and
   a second tap configured to detect a charge photoelectrically converted by the photoelectric conversion unit; and
a first comparison circuit configured to compare a first detection signal detected by the first tap and a reference signal;
a second comparison circuit configured to compare a second detection signal detected by the second tap and the reference signal;
a first zero reset signal generation circuit configured to generate a first zero reset signal that is supplied to the first comparison circuit when the first comparison circuit performs an auto zero operation; and
a second zero reset signal generation circuit configured to generate a second zero reset signal that is supplied to the second comparison circuit when the second comparison circuit performs an auto zero operation.
2. The light receiving device according to claim 1, wherein each of the first zero reset signal generation circuit and the second zero reset signal generation circuit includes a source follower circuit.
3. The light receiving device according to claim 1, wherein each of the first zero reset signal generation circuit and the second zero reset signal generation circuit includes a light shielded pixel configured to be the pixel shielded from light.
4. The light receiving device according to claim 1, wherein each of the first zero reset signal generation circuit and the second zero reset signal generation circuit includes a light shielded pixel, the light shielded pixel including the pixel arranged to be shielded from light and a source follower circuit.
5. The light receiving device according to claim 3, wherein the pixel comprises a plurality of pixels, and the light receiving device further comprises:
a pixel array unit in which pixels of the plurality of pixels are two-dimensionally arranged;
vertical signal lines each configured to transmit the first detection signal or the second detection signal of a pixel of the plurality of pixels in a vertical direction; and
switches each configured to connect two arbitrarily-defined vertical signal lines of the vertical signal lines, the two arbitrarily-defined vertival signal lines being adjacent in a horizontal direction, the switches each configured to connect the two arbitrarily-defined vertical signal lines when performing the auto zero operation.

6. The light receiving device according to claim 1, wherein the pixel comprises a plurality of pixels, and the light receiving device further comprises:
a pixel array unit in which pixels of the plurality of pixels are two-dimensionally arranged; and
four vertical signal lines configured to transmit the first and second detection signals of two pixels of the plurality of pixels, the two pixels being adjacent one another in a vertical direction in one pixel column,
wherein the light receiving device receives the first and second detection signals from the two pixels of the plurality of pixels so that both of the first and second detection signals are simultaneously read.
7. A method for controlling a light receiving device,
wherein the light receiving device includes:
a pixel including
   a first tap configured to detect a charge photoelectrically converted by a photoelectric conversion unit; and
   a second tap configured to detect a charge photoelectrically converted by the photoelectric conversion unit; and
a first comparison circuit configured to compare a first detection signal detected by the first tap and a reference signal; and
a second comparison circuit configured to compare a second detection signal detected by the second tap and the reference signal;
wherein the method comprises:
generating a first zero reset signal and supplying the first zero reset signal to the first comparison circuit when the first comparison circuit performs an auto zero operation, and
generating a second zero reset signal and supplying the second zero reset signal to the second comparison circuit when the second comparison circuit performs an auto zero operation.
8. An electronic apparatus comprising:
a light receiving device including:
a pixel including:
   a first tap configured to detect a charge photoelectrically converted by a photoelectric conversion unit; and
   a second tap configured to detect a charge photoelectrically converted by the photoelectric conversion unit; and
a first comparison circuit configured to compare a first detection signal detected by the first tap and a reference signal; and
a second comparison circuit configured to compare a second detection signal detected by the second tap and the reference signal; and
a first zero reset signal generation circuit configured to generate a first zero reset signal that is supplied to the first comparison circuit when the first comparison circuit performs an auto zero operation; and
a second zero reset signal generation circuit configured to generate a second zero reset signal that is supplied to the second comparison circuit when the second comparison circuit performs an auto zero operation.
9. A light receiving device comprising:
a pixel including:
   a first tap configured to detect a charge photoelectrically converted by a photoelectric conversion unit; and a second tap configured to detect a charge photoelectrically converted by the photoelectric conversion unit; and a first comparison circuit configured to compare a first detection signal detected by the first tap and a reference signal;

a second comparison circuit configured to compare a second detection signal detected by the second tap and the reference signal;

a first vertical signal line configured to transmit the first detection signal of the pixel to the first comparison circuit;

a second vertical signal line configured to transmit the second detection signal of the pixel to the second comparison circuit;

a first zero reset signal generation circuit connected to the first vertical signal line; and a second zero reset signal generation circuit connected to the second vertical signal line, wherein the first zero reset signal generation circuit and the second zero reset signal generation circuit are connected to a same control line, and a depth value corresponding to a distance to a subject is calculated in accordance with a difference between the first detection signal and the second detection signal.

* * * * *

UNITED STATES PATENT AND TRADEMARK OFFICE
CERTIFICATE OF CORRECTION

| | |
|---|---|
| PATENT NO. | : 11,057,580 B2 |
| APPLICATION NO. | : 16/422011 |
| DATED | : July 6, 2021 |
| INVENTOR(S) | : Yusuke Moriyama |

It is certified that error appears in the above-identified patent and that said Letters Patent is hereby corrected as shown below:

On the Title Page

After item (22), please insert the following section:
--(30) Foreign Application Priority Data
Jun. 27, 2018 (JP) ............................ 2018-122186--

Signed and Sealed this
First Day of October, 2024

Katherine Kelly Vidal
*Director of the United States Patent and Trademark Office*